(12) United States Patent
Inaba et al.

(10) Patent No.: US 7,449,733 B2
(45) Date of Patent: Nov. 11, 2008

(54) SEMICONDUCTOR DEVICE AND METHOD OF FABRICATING THE SAME

(75) Inventors: Satoshi Inaba, Yokohama (JP); Tetsu Morooka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 11/341,848

(22) Filed: Jan. 30, 2006

(65) Prior Publication Data
US 2007/0102761 A1    May 10, 2007

(30) Foreign Application Priority Data
Nov. 9, 2005    (JP) ............................. 2005-325023

(51) Int. Cl.
H01L 27/148    (2006.01)
H01L 29/768    (2006.01)
(52) U.S. Cl. ...................................... 257/250; 257/278
(58) Field of Classification Search ................. 257/347, 257/250, 278, 330–332, 365–366, 377
See application file for complete search history.

(56) References Cited

U.S. PATENT DOCUMENTS

| 5,773,331 | A | 6/1998 | Solomon et al. | |
|---|---|---|---|---|
| 6,525,403 | B2 | 2/2003 | Inaba et al. | |
| 6,646,307 | B1 * | 11/2003 | Yu et al. | 257/347 |
| 6,919,601 | B2 | 7/2005 | Inaba | |
| 7,067,868 | B2 * | 6/2006 | Thean et al. | 257/296 |
| 2006/0027870 | A1 | 2/2006 | Inaba | |

OTHER PUBLICATIONS

U.S. Appl. No. 11/005,477, filed Dec. 7, 2004, Inaba.
U.S. Appl. No. 11/097,387, filed Apr. 4, 2005, Inaba.
S. Harrison et al., "Highly Performant Double Gate MOSFET Realized with SON Process," International Electron Devices Meeting (IEDM), Technical Digest, 2003, 18.6, pp. 449-452.
K. W. Guarini et al., "Triple-Self-Aligned, Planar Double-Gate MOSFETs: Devices and Circuits," International Electron Devices Meeting (IEDM), Technical Digest, 2001, 19.2. pp. 425-428.
H.S. Philip Wong, "Novel Device Options for Sub-100 nm CMOS," 1999 IEDM Short Course, pp. 1-63.

* cited by examiner

*Primary Examiner*—Theresa T Doan
(74) *Attorney, Agent, or Firm*—Foley & Lardner LLP

(57) ABSTRACT

A semiconductor device includes a semiconductor substrate, a channel region formed above the semiconductor substrate, a first gate electrode formed above the channel region via a first gate insulating film, a second gate electrode formed below the channel region via a second gate insulating film to face the first gate electrode, a first insulating film covering side surfaces of the second gate electrode, a second insulating film covering a bottom surface of the second gate electrode, and a semiconductor layer which has an upper surface positioned above an upper surface of the first gate insulating film and side surfaces facing side surfaces of the first gate electrode, and in which a source region and drain region are formed. The side surfaces of the second gate electrode are aligned with or positioned inside the side surfaces of the semiconductor layer.

3 Claims, 22 Drawing Sheets

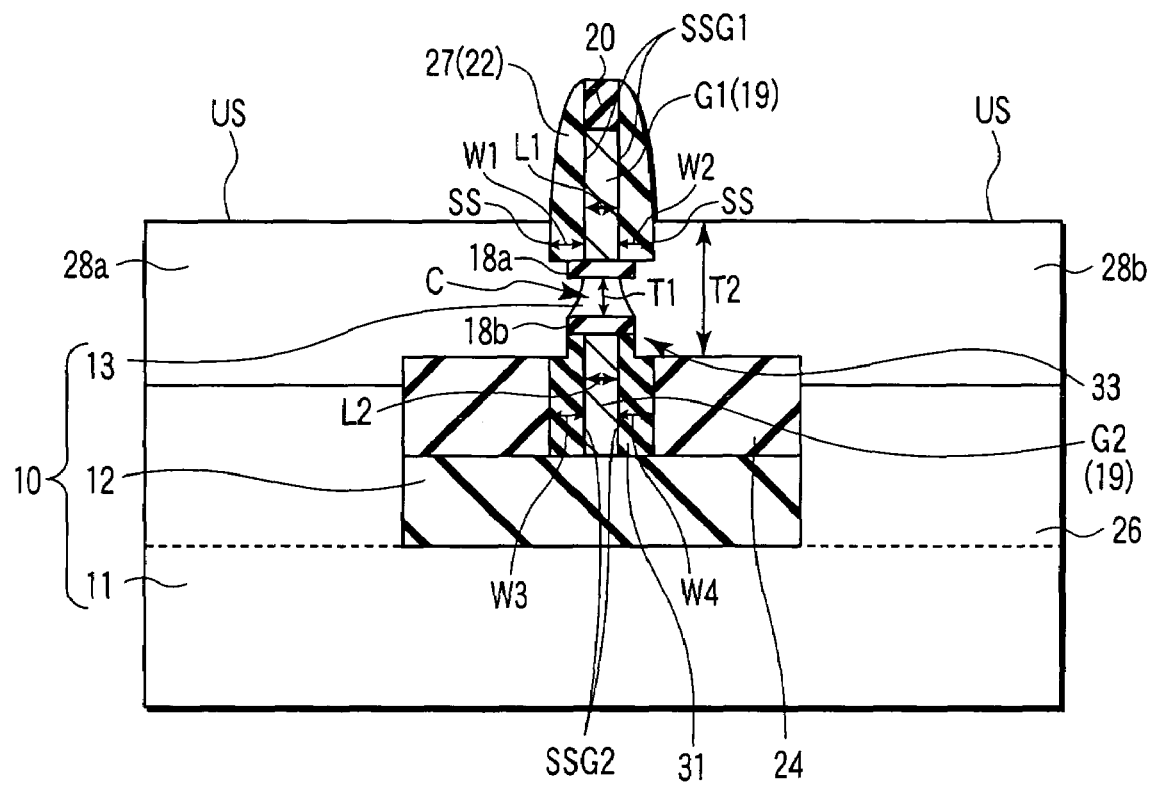
F I G. 15
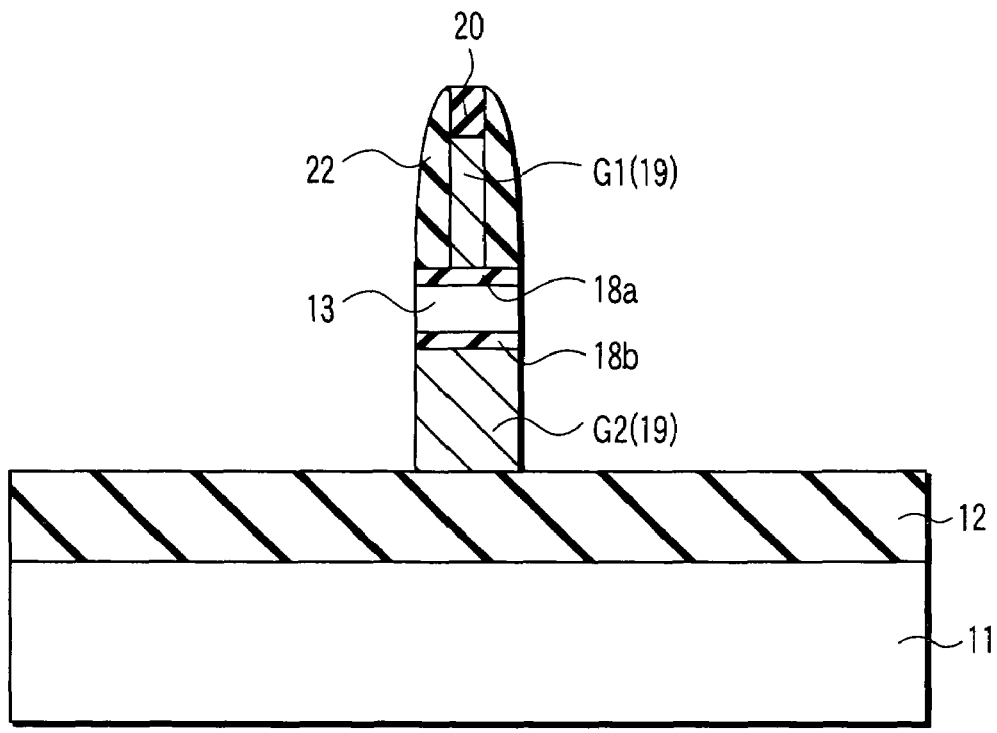
F I G. 16

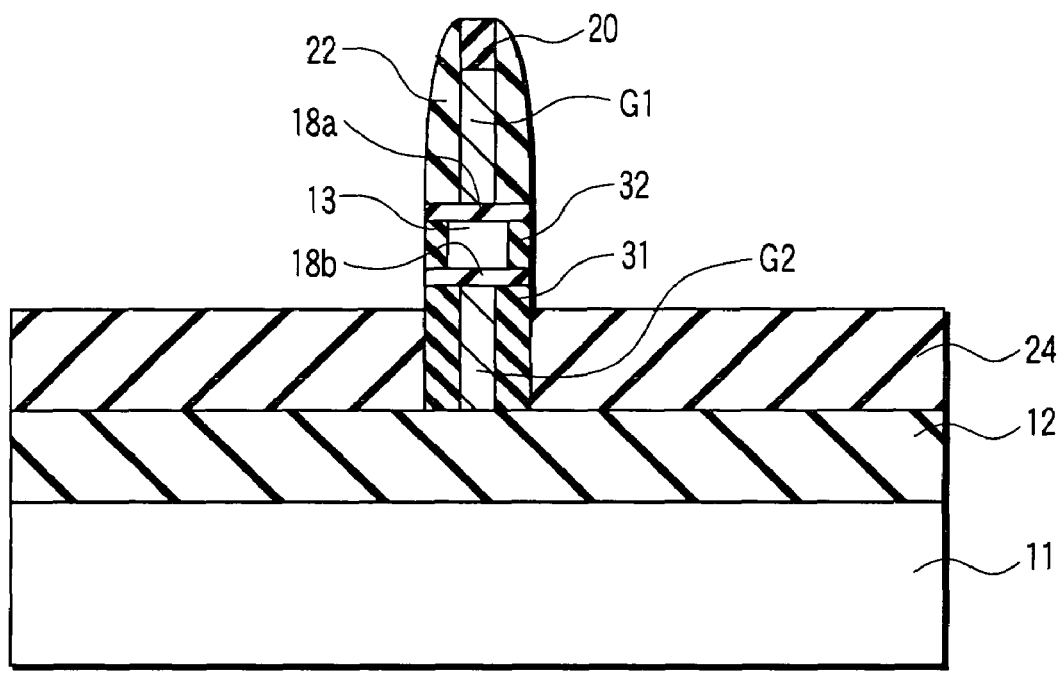
F I G. 19
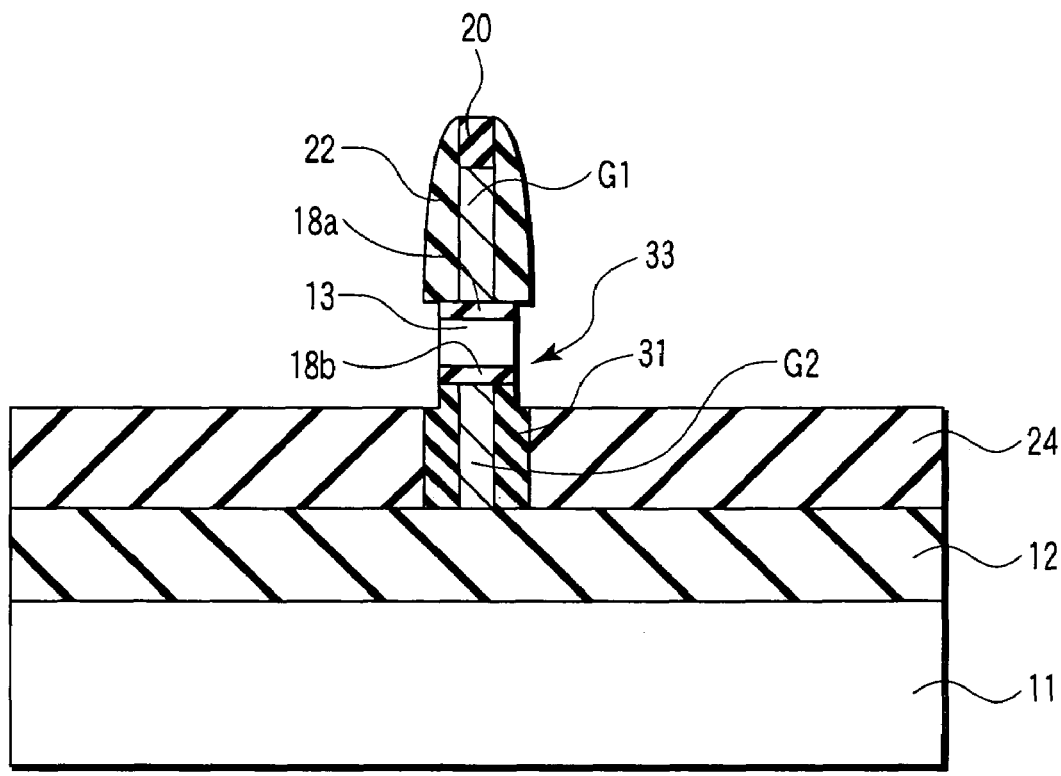
F I G. 20

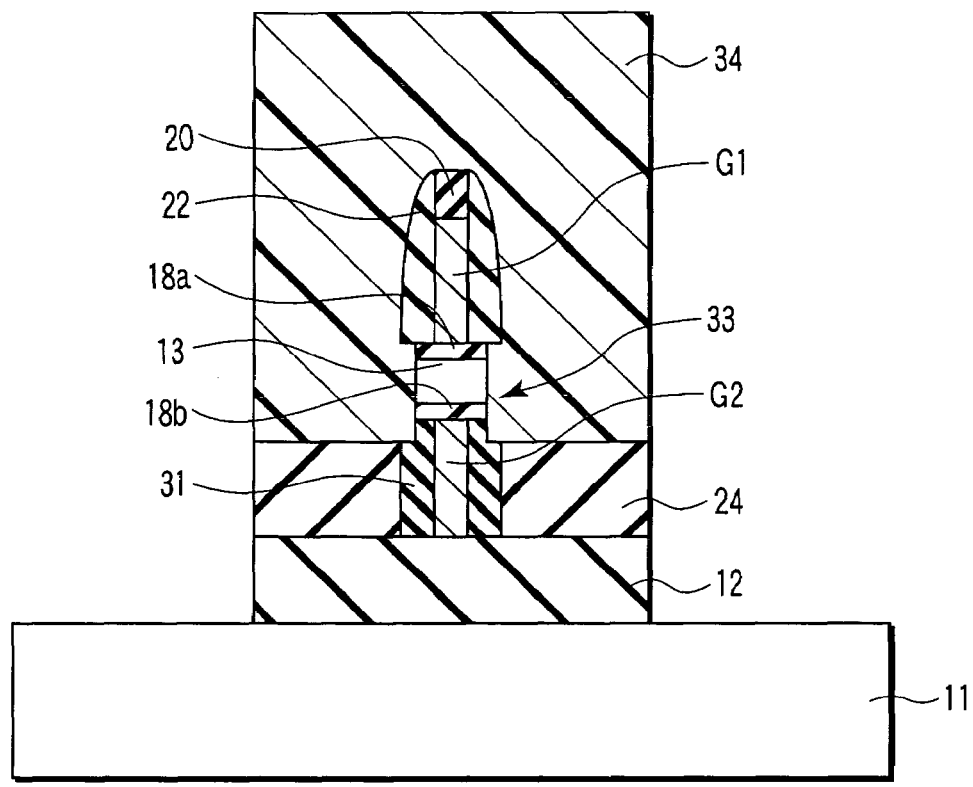
F I G. 21
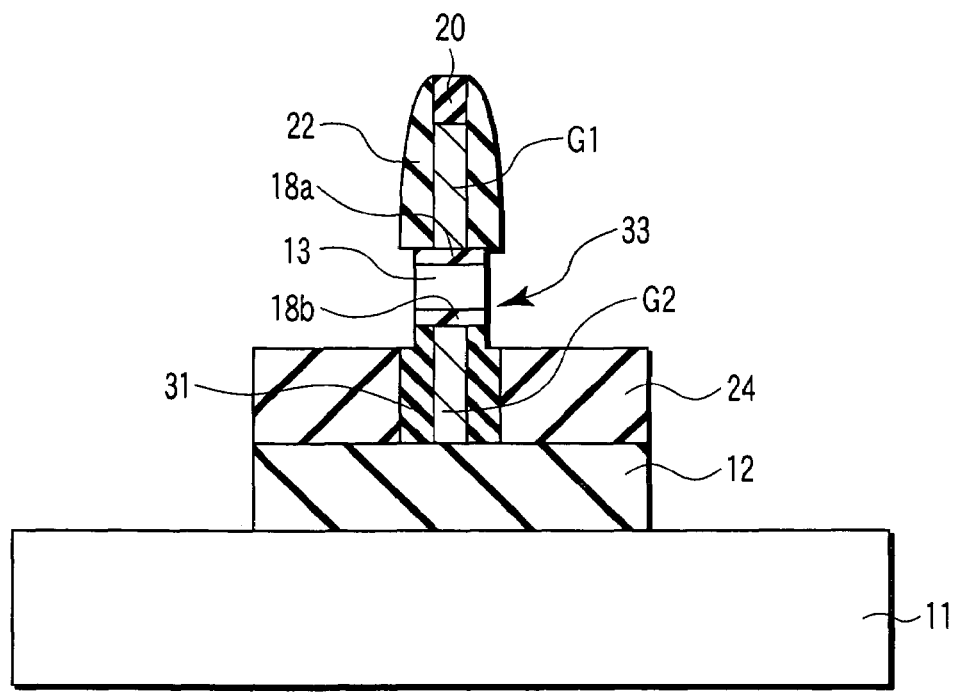
F I G. 22

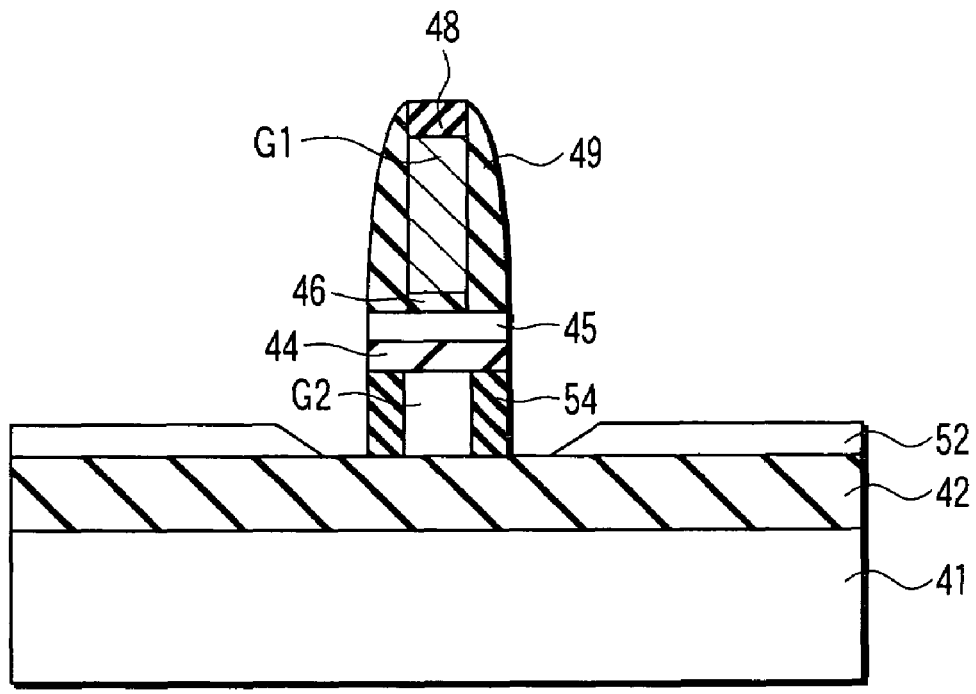
F I G. 31
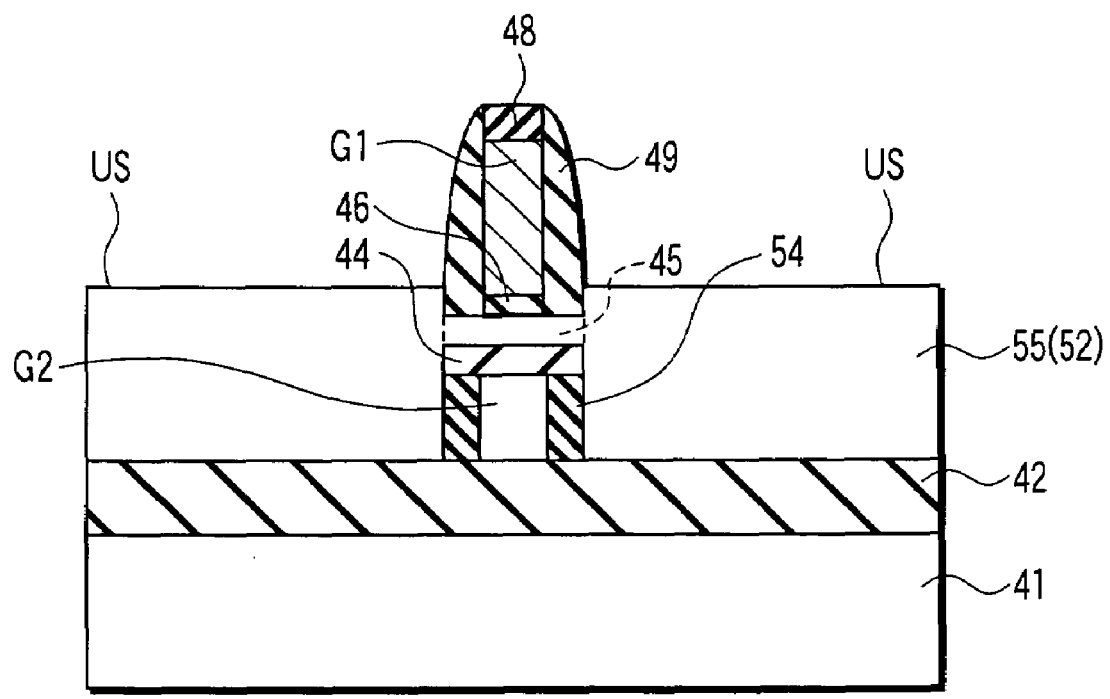
F I G. 32

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2005-325023, filed Nov. 9, 2005, the entire contents of which are incorporated herein by reference.

BACKGROUND OF THE INVENTION

1. Field of the Invention

The present invention relates to a double-gate semiconductor device having a top gate electrode and back gate electrode, and a method of fabricating the same.

2. Description of the Related Art

Recently, the performance of an LSI formed on a silicon substrate has been significantly improved by miniaturization of device dimensions used in the LSI. This is so because the gate length is decreased or the thickness of a gate insulating film is decreased on the basis of a so-called scaling law in a MOSFET used in a logic circuit or in a storage device such as an SRAM. Presently, to improve the cutoff characteristic of the MOSFET, a transistor called a double-gate MOSFET in which a gate region is additionally formed on the substrate side of the conventional planar MOSFET is proposed as one type of a MIS semiconductor device having a three-dimensional structure, and an attempt to improve the current characteristics of this double-gate MOSFET is already reported (e.g., S. Harrison et al., IEDM 2003, 18.6, pp. 449-452 (2003), K. W. Guarini et al., IEDM 2001, 19.2, pp. 425-428 (2001), U.S. Pat. No. 5,773,331).

Unfortunately, the double-gate MOSFET, particularly, the planar double-gate MOSFET is very difficult to fabricate, and it is also difficult to obtain desired device characteristics. Root causes of this problem are that it is difficult to form the top gate electrode and back gate electrode in self-alignment with each other, and it is also difficult to make the gate lengths of the top gate electrode and back gate electrode equal to each other.

In the planar double-gate MOSFET by S. Harrison et al., for example, a technique called SON (Silicon On Nothing) is used to form an air gap immediately below the channel region, and then form the gate insulators and the gate electrodes (see FIG. 1 of S. Harrison et al.) In this method, however, it is difficult to use a mask process when the back gate electrode is processed. Since the air gap is filled with the material as the back gate electrode, the gate length of the back gate electrode is much larger than that of the top gate electrode (see FIG. 5 of S. Harrison et al.) This large (length) back gate electrode increases the overlap region of the back gate electrode and a source/drain region, therefore, a parasitic gate overlap capacitance Cov in this portion much increases. Consequently, the DC characteristics may improve by the back-gate control, but the speed of an AC operation would be decreased. (see FIGS. 14 and 15 of S. Harrison et al.) The planar double-gate MOSFET by K. W. Guarini et al. is also called a PAGODA which is obtained by forming a double-gate MOSFET structure by separately forming a top gate electrode and back gate electrode, and bonding these electrodes (see FIG. 1 of K. W. Guarini et al.) Since the bonding technique is used, channel portions except for the gate electrodes can be laid out without major constraint, and a separate gate structure is also available (applicable) (see FIG. 1C of K. W. Guarini et al.) However, the fabrication process is very complicated. In particular, the thickness of the Si channel region is decreased by using CMP (Chemical Mechanical Polish) or the combination of Si oxidation and $SiO_2$ removal many times, so thickness variations between the device patterns are expected to be large. These variations are directly related to (or concerned with) the variations in threshold voltage.

BRIEF SUMMARY OF THE INVENTION

A semiconductor device according to the first aspect of the present invention comprises a semiconductor substrate, a channel region formed above the semiconductor substrate, a first gate electrode formed above the channel region via a first gate insulating film, a second gate electrode formed below the channel region via a second gate insulating film to face the first gate electrode, a first insulating film covering side surfaces of the second gate electrode, a second insulating film covering a bottom surface of the second gate electrode, and a semiconductor layer which has an upper surface positioned above an upper surface of the first gate insulating film and side surfaces facing side surfaces of the first gate electrode, and in which a source region and drain region are formed. The side surfaces of the second gate electrode are aligned with or positioned inside the side surfaces of the semiconductor layer.

A semiconductor device fabrication method according to the second aspect of the present invention comprises forming a first gate electrode above a channel region via a first gate insulating film, forming a first gate sidewall layer on side surfaces of the first gate electrode, forming a second gate electrode in self-alignment with the first gate electrode below the channel region via a second gate insulating film, forming a second gate sidewall layer on side surfaces of the second gate electrode, forming an epitaxial layer near the channel region and first and second gate sidewall layers by epitaxial growth, the epitaxial layer having an upper surface positioned above an upper surface of the first gate insulating film and side surfaces facing side surfaces of the first gate electrode, and forming a source region and drain region in the epitaxial layer. The side surfaces of the second gate electrode are aligned with or positioned inside the side surfaces of the epitaxial layer.

BRIEF DESCRIPTION OF THE SEVERAL VIEWS OF THE DRAWING

FIG. 15 is a sectional view showing a semiconductor device according to the second embodiment of the present invention;

FIGS. 16, 17, 18, 19, 20, 21, 22, and 23 are sectional views showing fabrication steps of the semiconductor device according to the second embodiment of the present invention;

FIGS. 25, 26, 27, 28, 29, 30, 31, and 32 are sectional views showing fabrication steps of the semiconductor device according to the third embodiment of the present invention.

DETAILED DESCRIPTION OF THE INVENTION

Figure 1A:
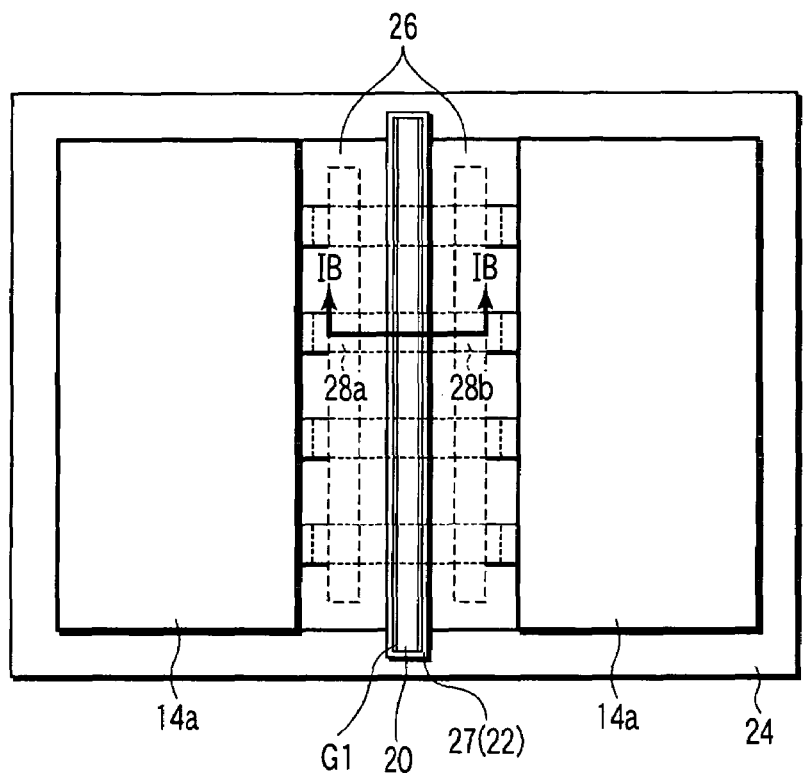
FIG. 1A is a plan view showing a semiconductor device according to the first embodiment of the present invention.

Embodiments of the present invention will be described below with reference to the accompanying drawing. In the following explanation, the same reference numerals denote the same parts throughout the drawing.

FIRST EMBODIMENT

The first embodiment is a planar double-gate MOSFET in which a top gate electrode G1 and back gate electrode G2 are formed in self-alignment with each other.

Figure 1B:
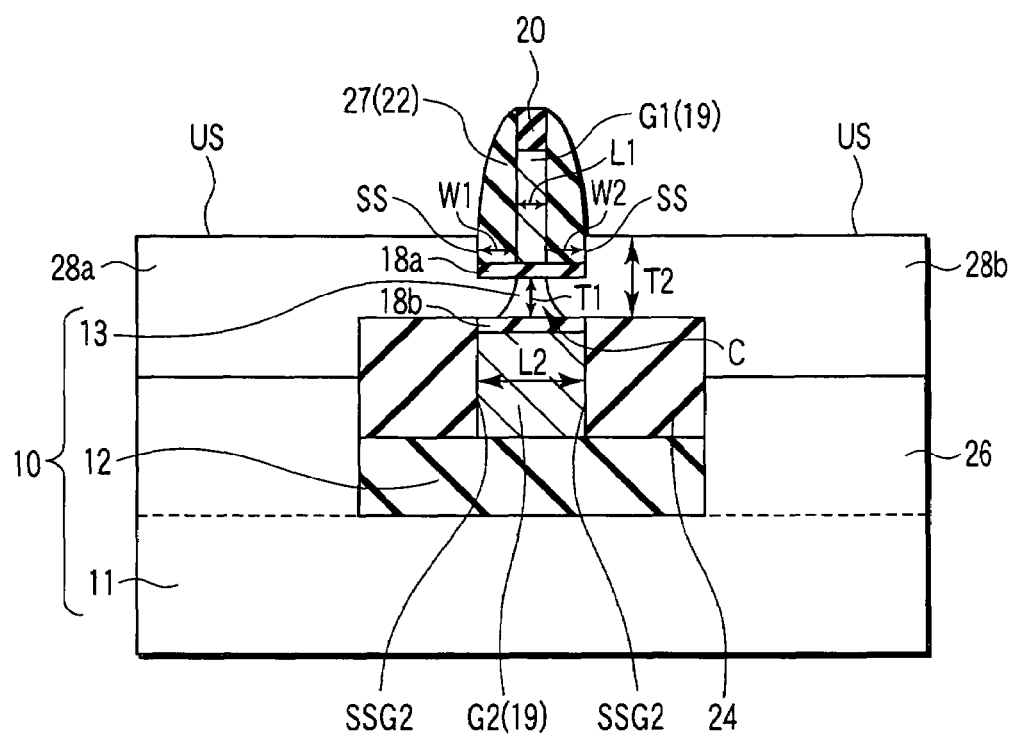
FIG. 1B is a cross sectional view taken along a line IB—IB in FIG. 1A.

FIGS. 1A and 1B are a plan view and sectional view, respectively, of a semiconductor device according to the first embodiment of the present invention. This semiconductor device according to the first embodiment will be explained below.

As shown in FIGS. 1A and 1B, the first embodiment uses an SGOI (Silicon Germanium On Insulator) substrate 10 made up of a silicon substrate (semiconductor substrate) 11, buried insulating film 12, and Si/SiGe layer (semiconductor layer) 13. An epitaxial layer 26 is formed by epitaxially growing Si in the silicon substrate 11 and Si/SiGe layer 13, and a pair of a source diffusion region 28a and drain diffusion layer 28b is formed on the surface of the epitaxial layer 26. A channel region C which connects the source diffusion region 28a and drain diffusion region 28b is formed between them.

The top gate (front gate) electrode G1 is formed on the channel region C via a first gate insulating film 18a. A gate sidewall layer 27 is formed on the side surfaces of the top gate electrode G1, and a mask material 20 is formed on the upper surface of the top gate electrode G1.

The back gate (bottom gate) electrode G2 is formed below the channel region C via a second gate insulating film 18b. The side surfaces of the back gate electrode G2 are covered with an interlayer dielectric film 24, and the bottom surface of the back gate electrode G2 is covered with a buried insulating film 12.

An upper surface US of the epitaxial layer 26 is positioned above the upper surface of the first gate insulating film 18a. Surfaces SS, which face the top gate electrode G1, of the epitaxial layer 26 are in contact with the first gate insulating film 18a and gate sidewall layer 27.

The back gate electrode G2 is formed in self-alignment with the top gate electrode G1 and gate sidewall layer 27. Therefore, side surfaces SSG2 of the back gate electrode G2 are aligned with those of the gate sidewall layer 27. In other words, the side surfaces SSG2 of the back gate electrode G2 are aligned with the side surfaces SS of the epitaxial layer 26. Accordingly, the gate length L2 of the back gate electrode G2 is equal to the sum of the gate length L1 of the top gate electrode G1 and widths W1 and W2 of the gate sidewall layer 27, i.e., the gate length L2 of the back gate electrode G2 is larger than the gate length (channel length) L1 of the top gate electrode G1. Note that the widths W1 and W2 of the gate sidewall layer 27 are those of the lower portions of the gate sidewall layer 27, e.g., those of portions near the first gate insulating film 18a and positioned below the upper surface US of the epitaxial layer 26.

The source diffusion region 28a and drain diffusion region 28b are formed on the epitaxial layer 26 which is formed by epitaxially growing Si in the silicon substrate 11 and Si/SiGe layer 13. Therefore, the source diffusion region 28a and drain diffusion region 28b are connected to the silicon substrate 11 via the epitaxial layer 26.

The upper surface of the interlayer dielectric film 24 is on the same level as the upper surface of the second gate insulating film 18b. The side surfaces on the opposite sides of the interlayer dielectric film 24 from the back gate electrode G2 are aligned with the side surfaces of the buried insulating film 12.

The top gate electrode G1 and back gate electrode G2 are made of the same material (e.g., polysilicon layers 19) in this embodiment, although they may also be made of different materials.

The first and second gate insulating films 18a and 18b are made of the same material (e.g., $SiO_2$ films) in this embodiment, although they may also be made of different materials. The film thicknesses of the first and second gate insulating films 18a and 18b are the same in this embodiment, although they may also be different from each other.

FIGS. 2A to 14A and FIGS. 2B to 14B are plan views and cross sectional views, respectively, of fabrication steps of the semiconductor device according to the first embodiment of the present invention. Each figures B is sectional view taken along a line B—B in each figures A. A method of fabricating the semiconductor device according to the first embodiment will be briefly described below.

Figure 2A:
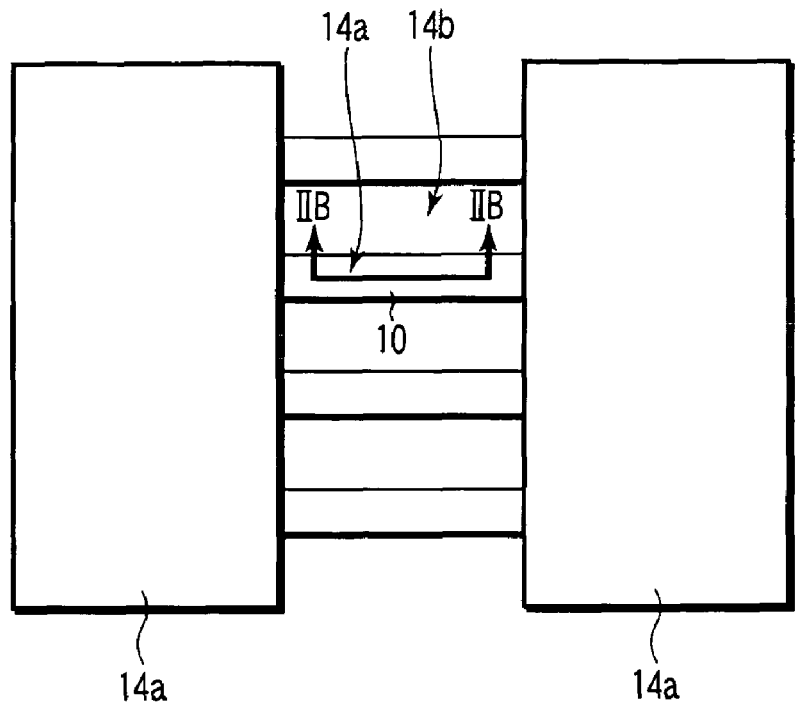
FIG. 2A is a plan view showing a fabrication step of the semiconductor device according to the first embodiment of the present invention.
Figure 2B:
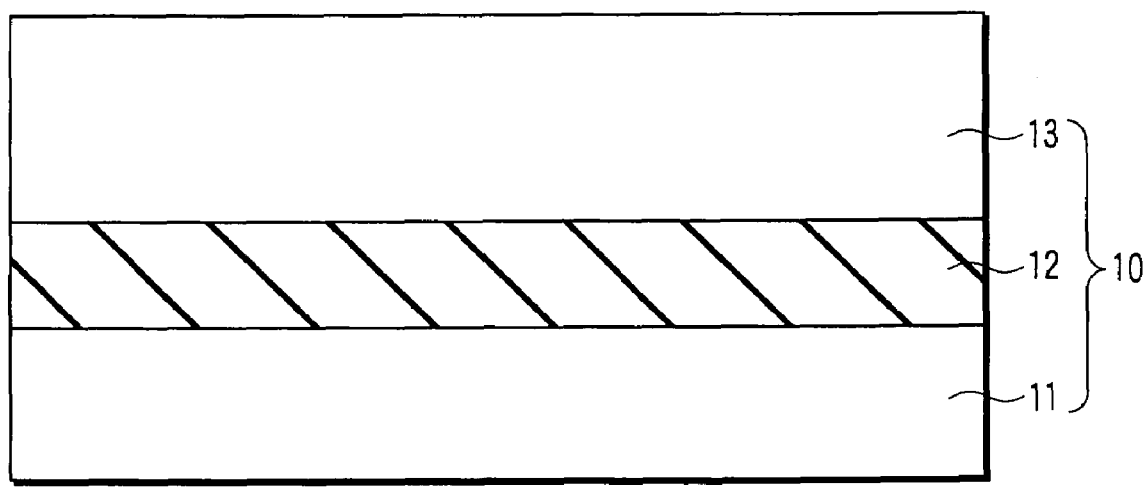
FIG. 2B is a sectional view taken along a line IIB—IIB in FIG. 2A.

First, as shown in FIGS. 2A and 2B, an SGOI substrate 10 is used in the first embodiment. The SGOI substrate 10 is made up of a silicon substrate 11, buried insulating film 12, and Si/SiGe layer 13. In the Si/SiGe layer 13, a SiGe layer is positioned on the side of the buried insulating film 12, and the Ge concentration in this SiGe layer is as high as, e.g., 20% or more. Note that the SiGe layer may also be formed by Ge condensation method. As shown in FIG. 2B, an device isolation region 14b for isolating an device region (active region) 14a is formed in the SGOI substrate 10.

Figure 3A:
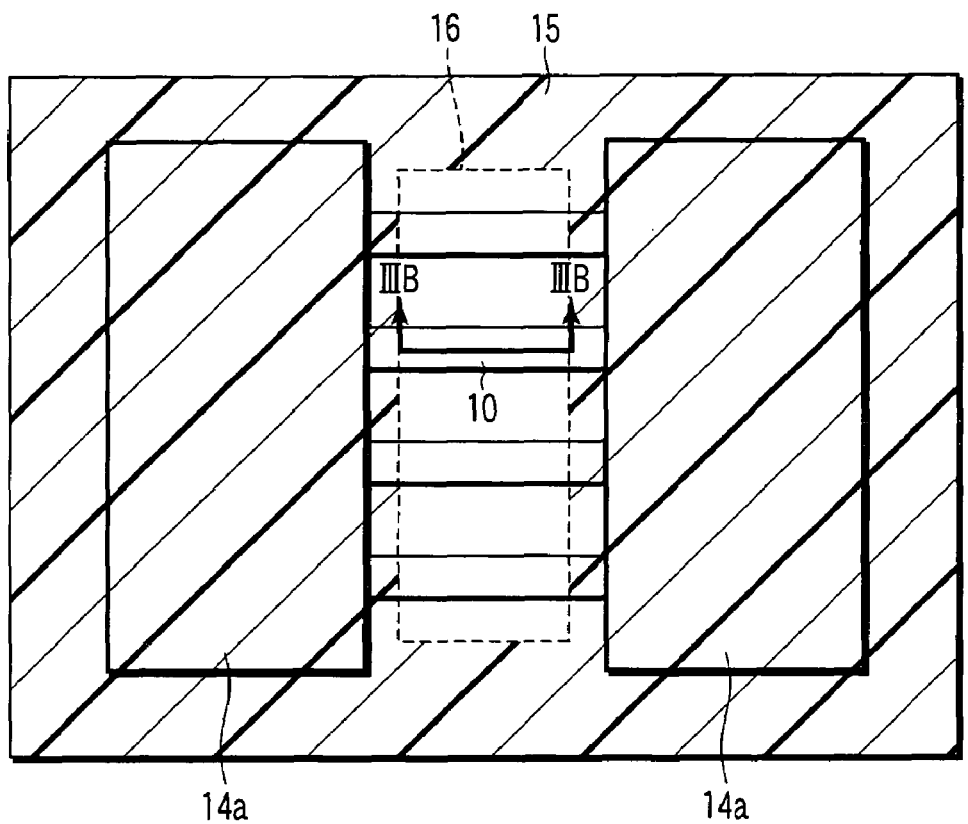
FIG. 3A is a plan view showing a fabrication step, following FIG. 2A, of the semiconductor device according to the first embodiment of the present invention.
Figure 3B:
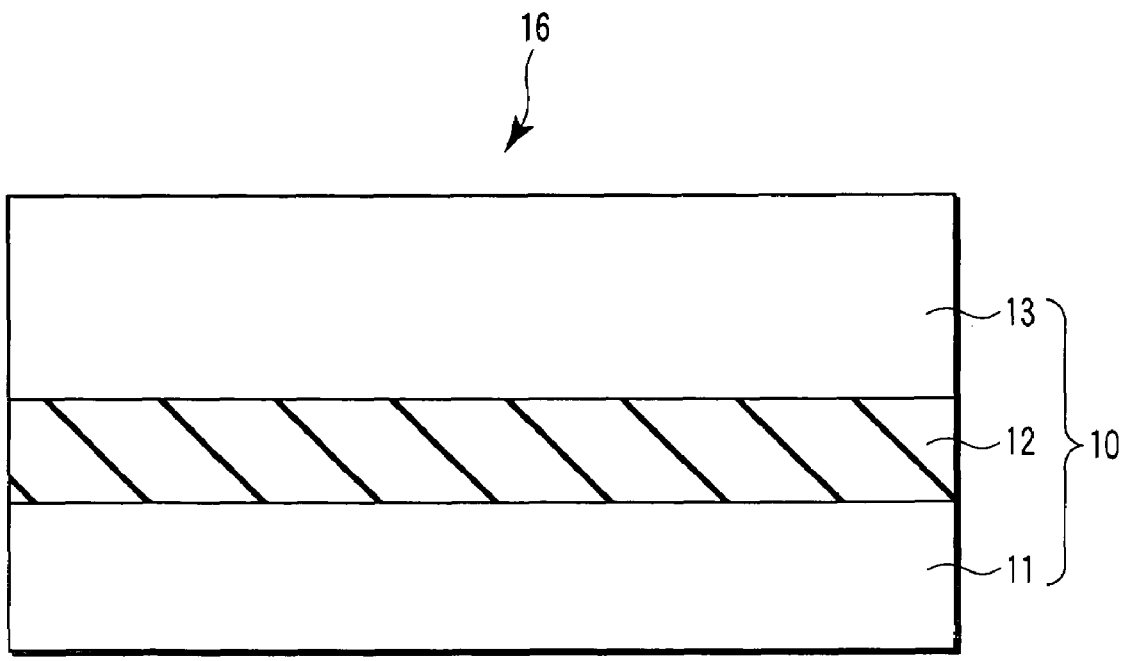
FIG. 3B is a sectional view taken along a line IIIB—IIIB in FIG. 3A.

Then, as shown in FIGS. 3A and 3B, a resist 15 is formed on the Si/SiGe layer 13, and patterned. In this manner, a hole 16 is formed around a prospective channel region of the Si/SiGe layer 13.

Figure 4A:
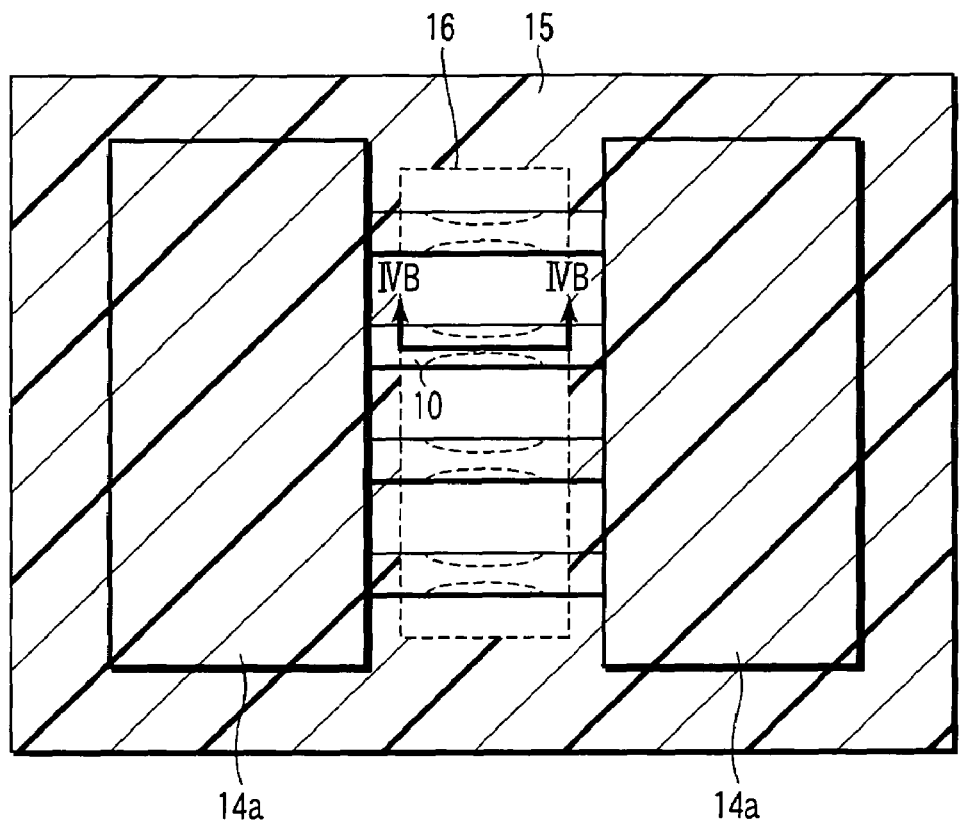
FIG. 4A is a plan view showing a fabrication step, following FIG. 3A, of the semiconductor device according to the first embodiment of the present invention.
Figure 4B:
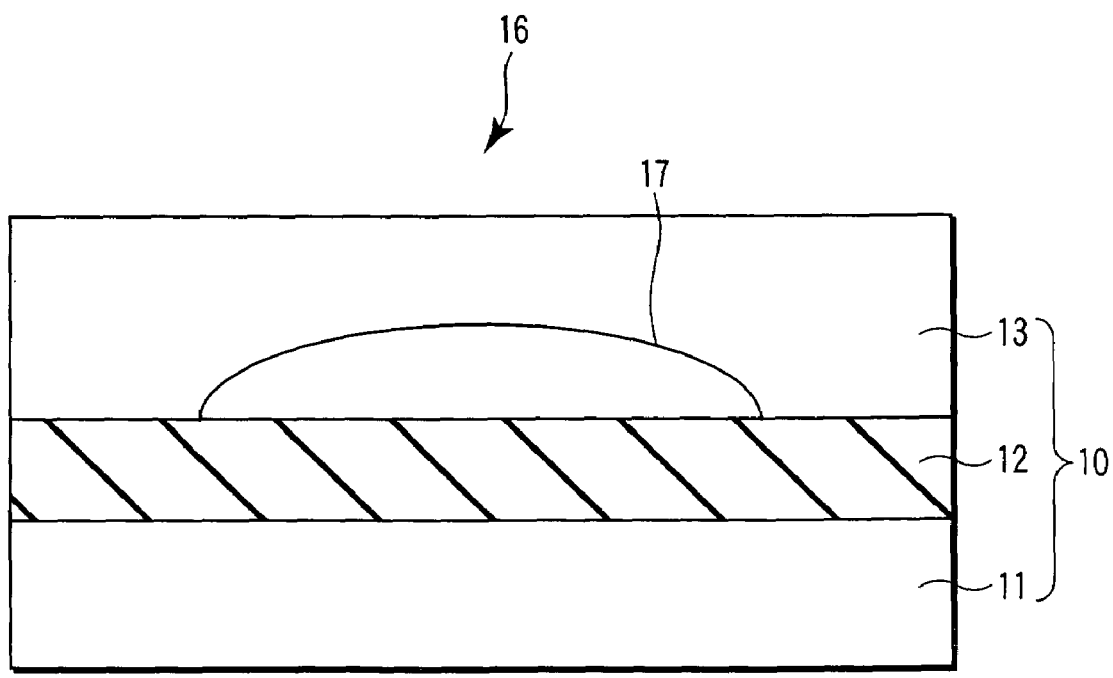
FIG. 4B is a cross sectional view taken along a line IVB—IVB in FIG. 4A.
Figure 5A:
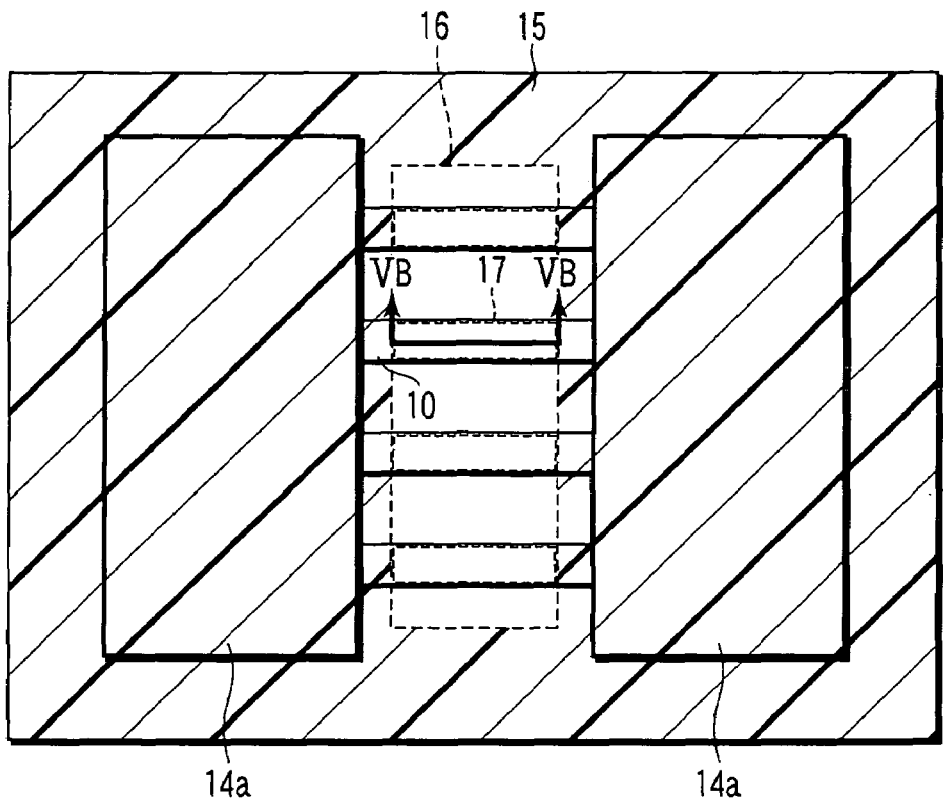
FIG. 5A is a plan view showing a fabrication step, following FIG. 4A, of the semiconductor device according to the first embodiment of the present invention.
Figure 5B:
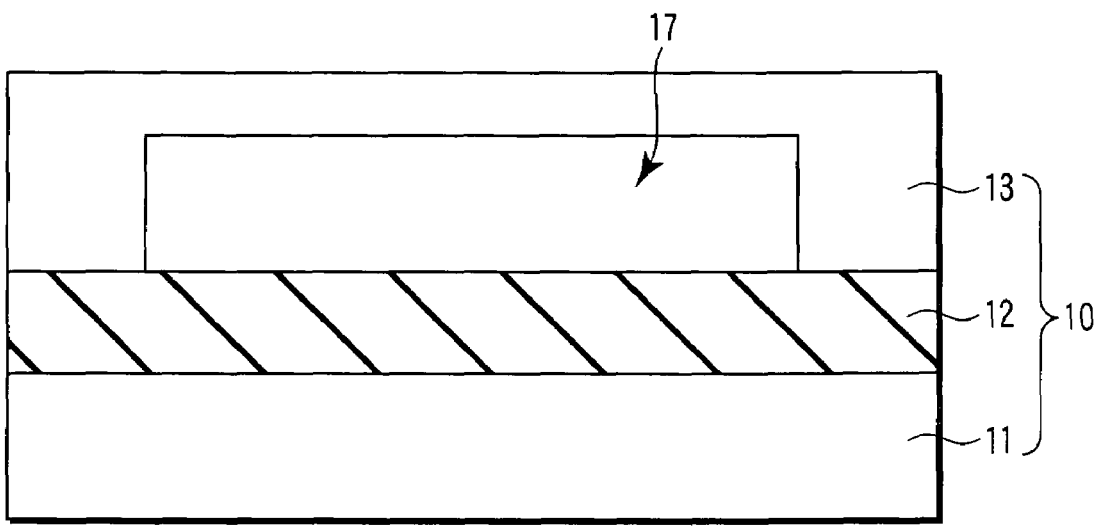
FIG. 5B is a sectional view taken along a line VB—VB in FIG. 5A.

As shown in FIGS. 4A and 4B, a solution that etches only the SiGe layer of the Si/SiGe layer 13 is used to selectively remove this SiGe layer from the hole 16 in the resist 15 by wet etching. Accordingly, as shown in FIGS. 5A and 5B, a hollow 17 is formed in the Si/SiGe layer 13. After that, the resist 15 is removed.

Figure 6A:
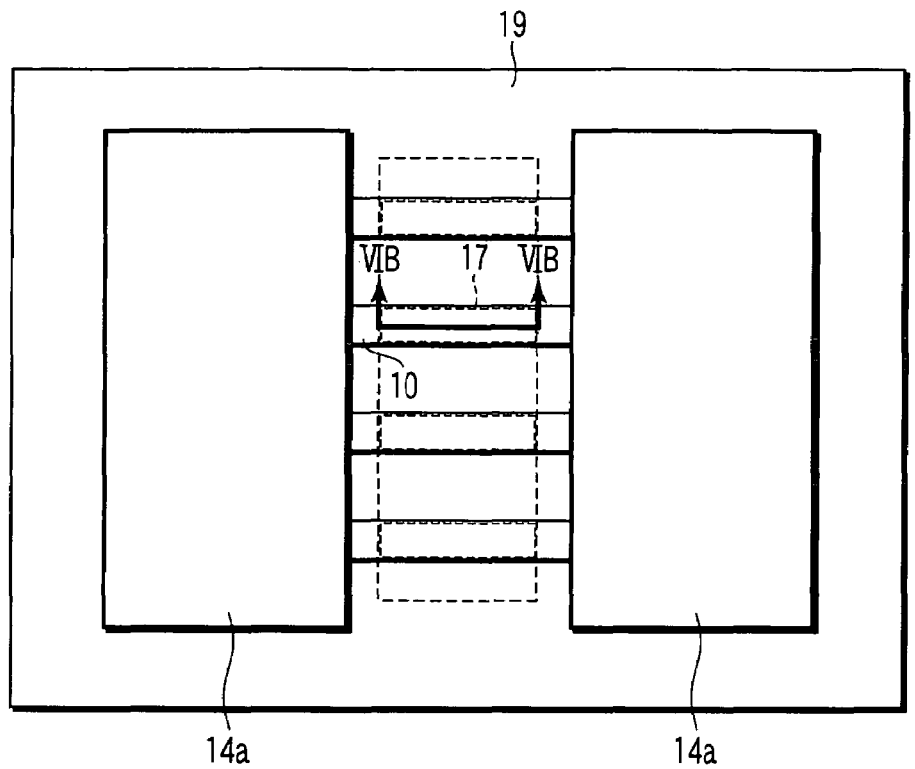
FIG. 6A is a plan view showing a fabrication step, following FIG. 5A, of the semiconductor device according to the first embodiment of the present invention.
Figure 6B:
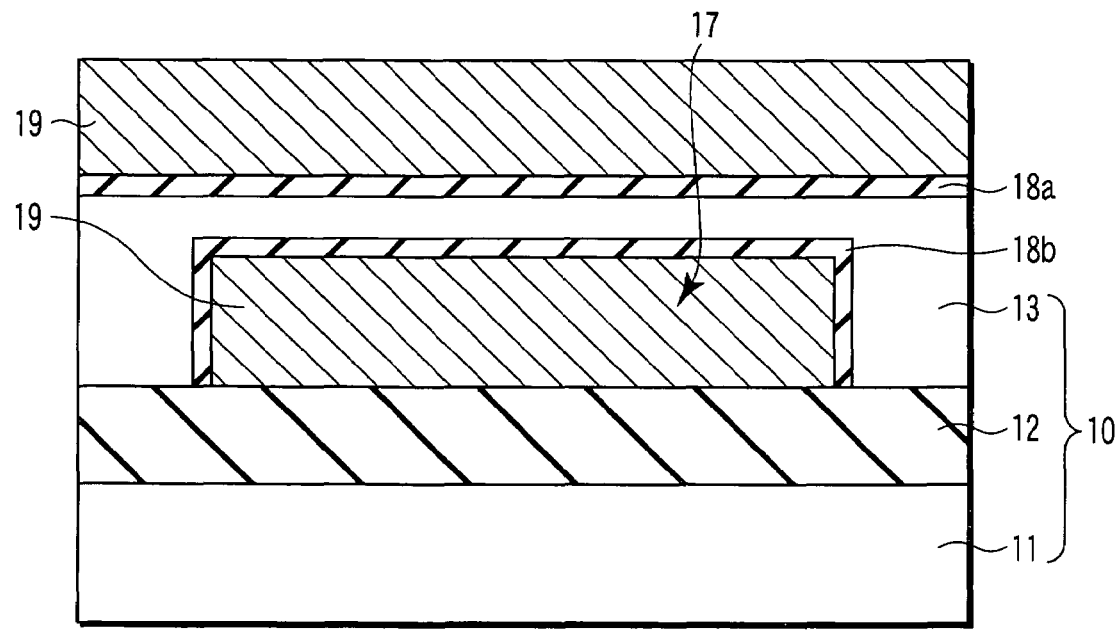
FIG. 6B is a sectional view taken along a line VIB—VIB in FIG. 6A.

Then, as shown in FIGS. 6A and 6B, the surface of the exposed channel (Si/SiGe layer 13) is thermally oxidized to form first and second gate insulating films 18a and 18b. Note that as the first and second gate insulating films 18a and 18b, high-k films or the like may also be formed by CVD (Chemical Vapor Deposition). Subsequently, CVD is used to deposit polysilicon layers 19 as a gate material on the first gate insulating film 18a and in the hollow 17. Note that the gate material is not limited to the polysilicon layers 19, and it is also possible to use a metal material having an appropriate work function, such as TaN or TiN.

Figure 7A:
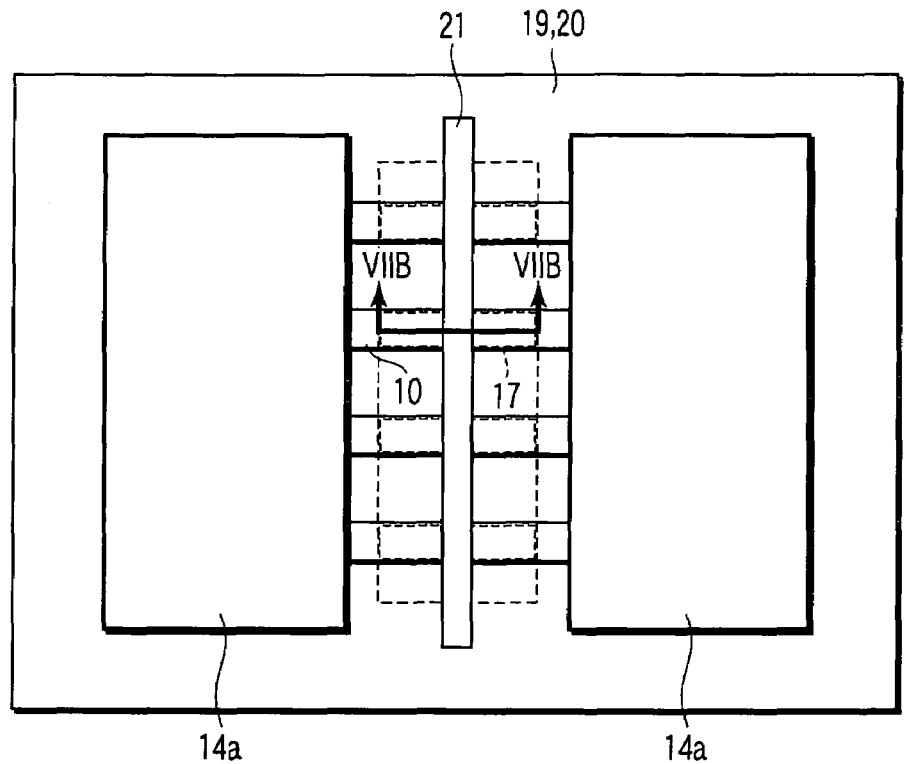
FIG. 7A is a plan view showing a fabrication step, following FIG. 6A, of the semiconductor device according to the first embodiment of the present invention.
Figure 7B:
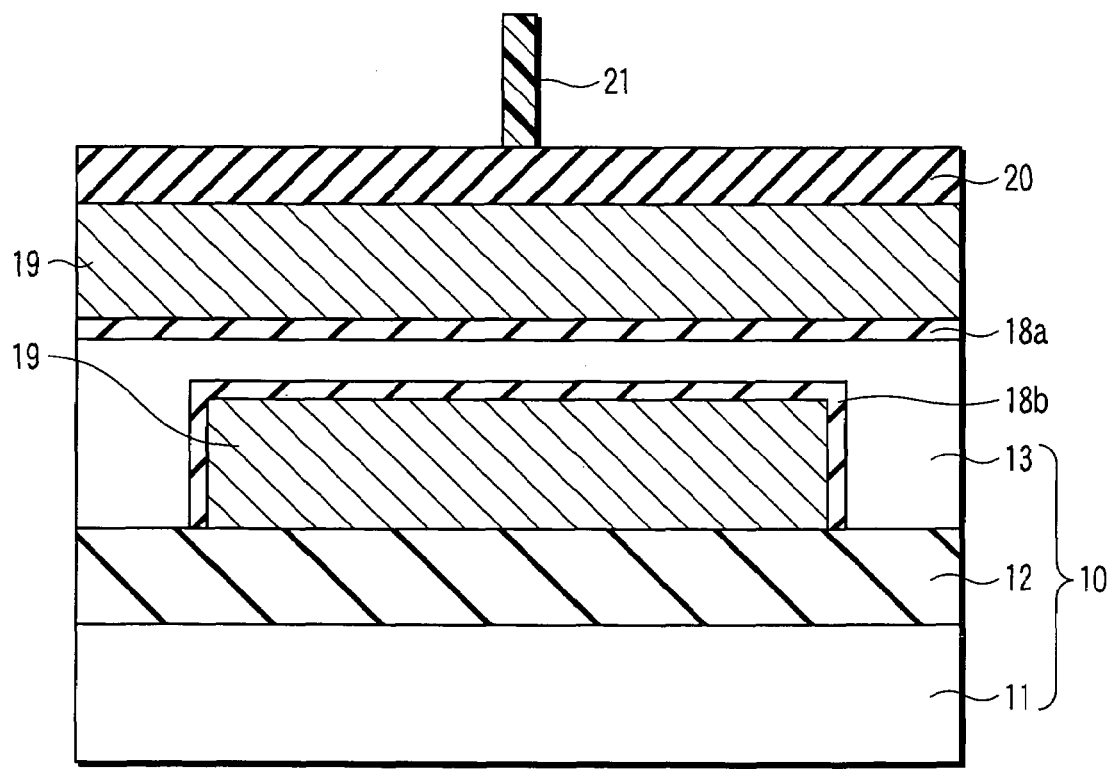
FIG. 7B is a sectional view taken along a line VIIB—VIIB in FIG. 7A.

As shown in FIGS. 7A and 7B, a mask material (e.g., SiN) 20 is formed on the polysilicon layer 19 by using CVD. A resist 21 is then formed on the mask material 20, and patterned.

Figure 8A:
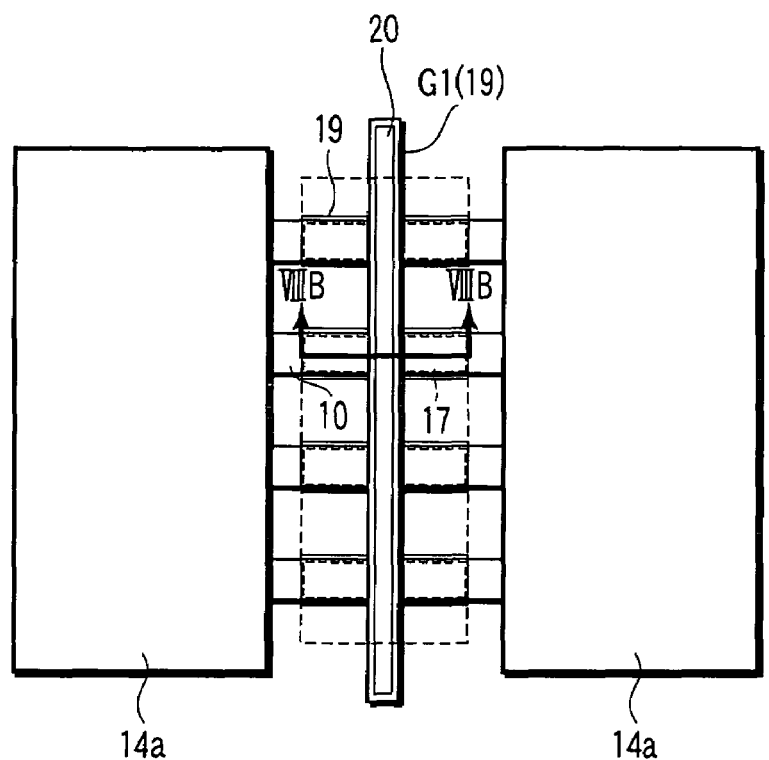
FIG. 8A is a plan view showing a fabrication step, following FIG. 7A, of the semiconductor device according to the first embodiment of the present invention.
Figure 8B:
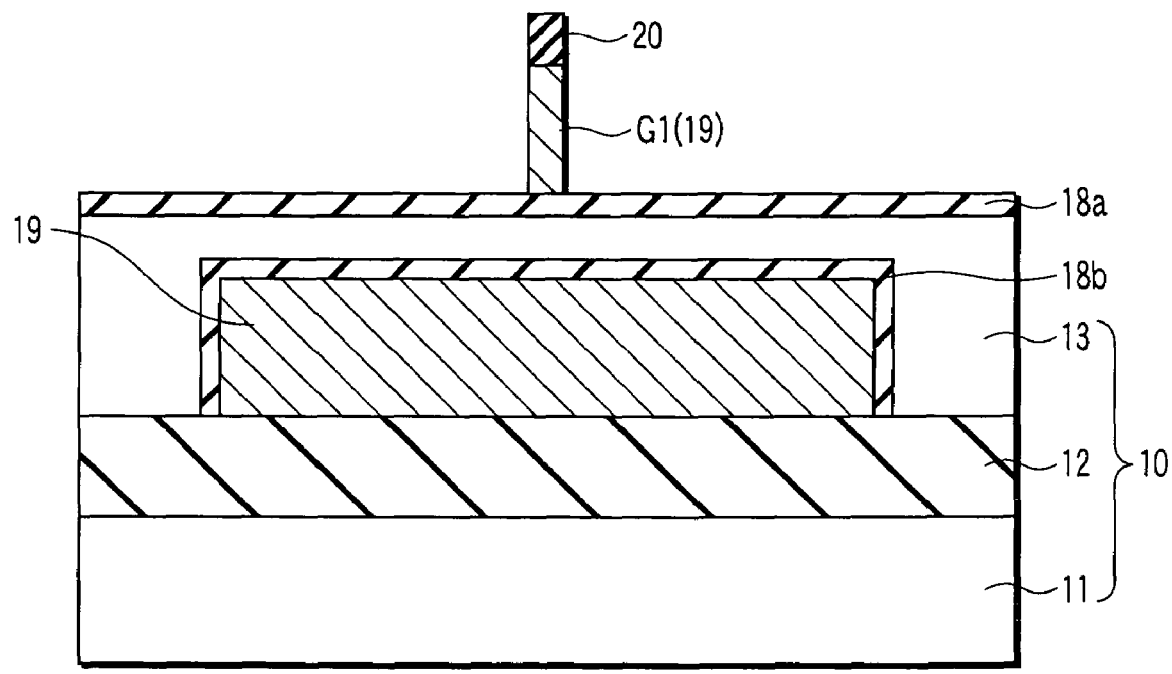
FIG. 8B is a sectional view taken along a line VIIIB—VIIIB in FIG. 8A.

As shown in FIGS. 8A and 8B, the pattern of the resist 21 is transferred onto the mask material 20. The patterned mask material 20 is used to etch the polysilicon layer 19 on the first gate insulating film 18a by anisotropic etching such as RIE (Reactive Ion Etching). In this way, a top gate electrode G1 is formed. Note that the mask material 20 desirably remains on the top gate electrode G1 after the polysilicon layer 19 is processed.

Figure 9A:
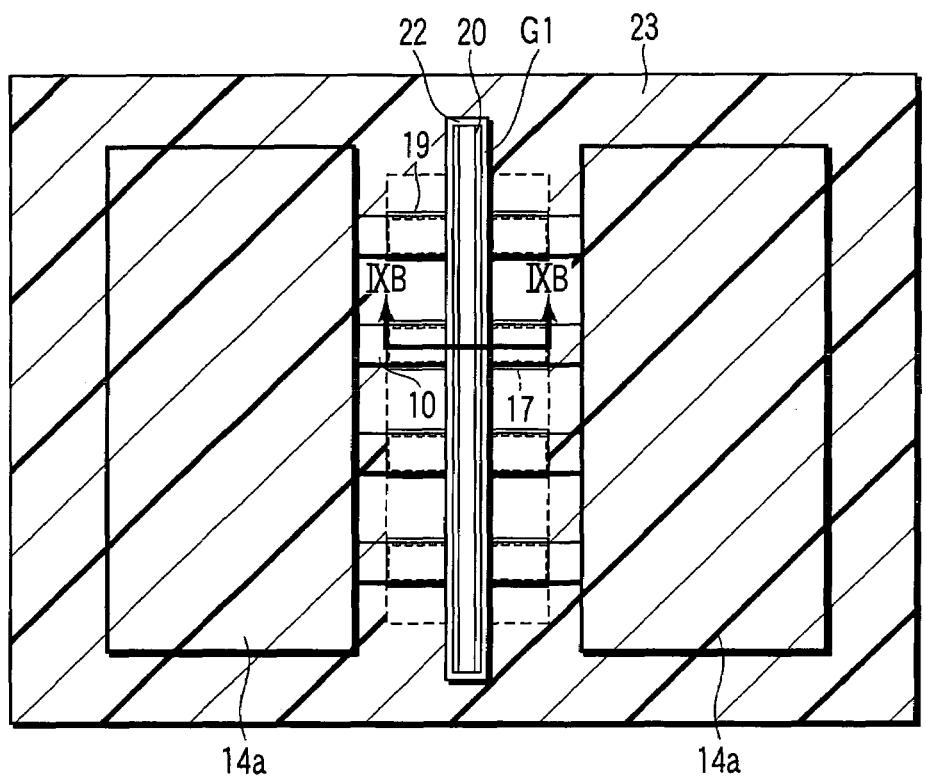
FIG. 9A is a plan view showing a fabrication step, following FIG. 8A, of the semiconductor device according to the first embodiment of the present invention.
Figure 9B:
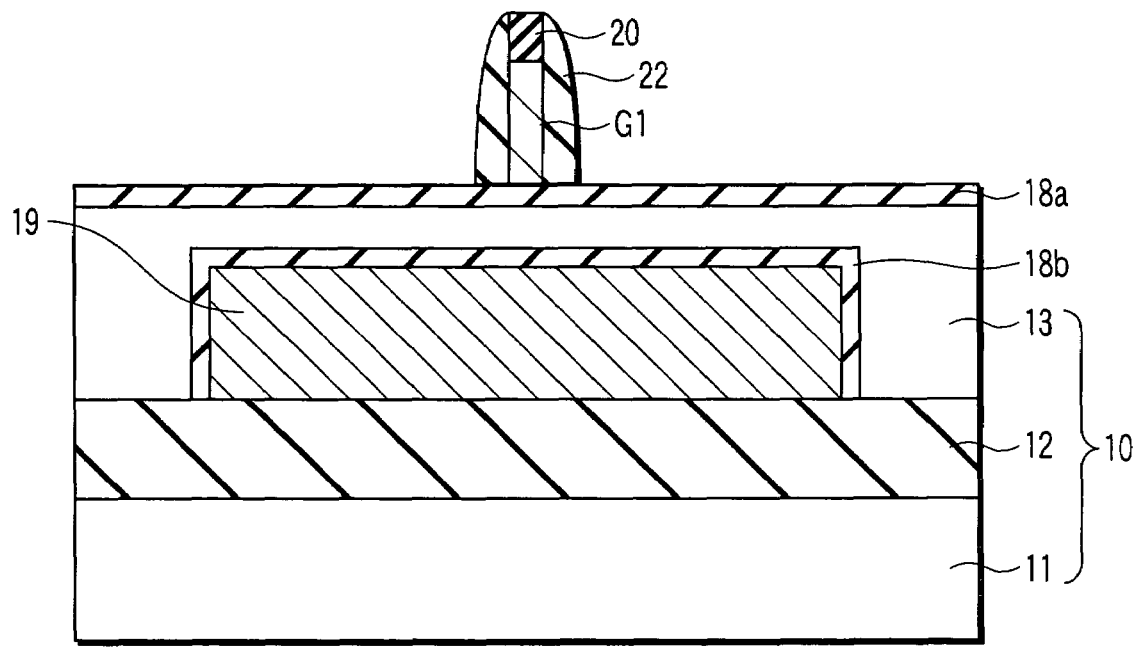
FIG. 9B is a sectional view taken along a line IXB—IXB in FIG. 9A.

As shown in FIGS. 9A and 9B, a gate sidewall layer 22 is formed on the side surfaces of the top gate electrode G1 and mask material 20. SiN or the like can be used as the material of the gate sidewall layer 22 in consideration of decreasing a facet because epitaxial growth is normally performed. Since, however, the material functions as a mask material in Si etching to be performed later, it is also possible to use TEOS (Tetra Ethyl Ortho Silicate) which is an $SiO_2$-based film as a material having high selectivity to Si. After that, a resist 23 is formed and patterned.

Figure 10A:
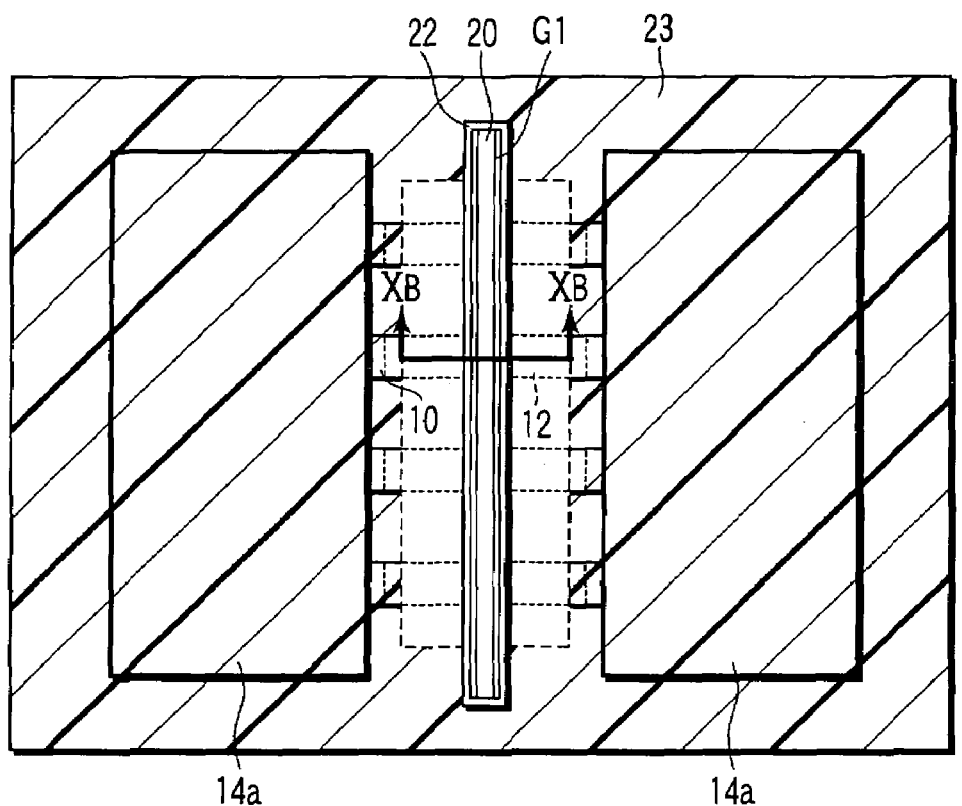
FIG. 10A is a plan view showing a fabrication step, following FIG. 9A, of the semiconductor device according to the first embodiment of the present invention.
Figure 10B:
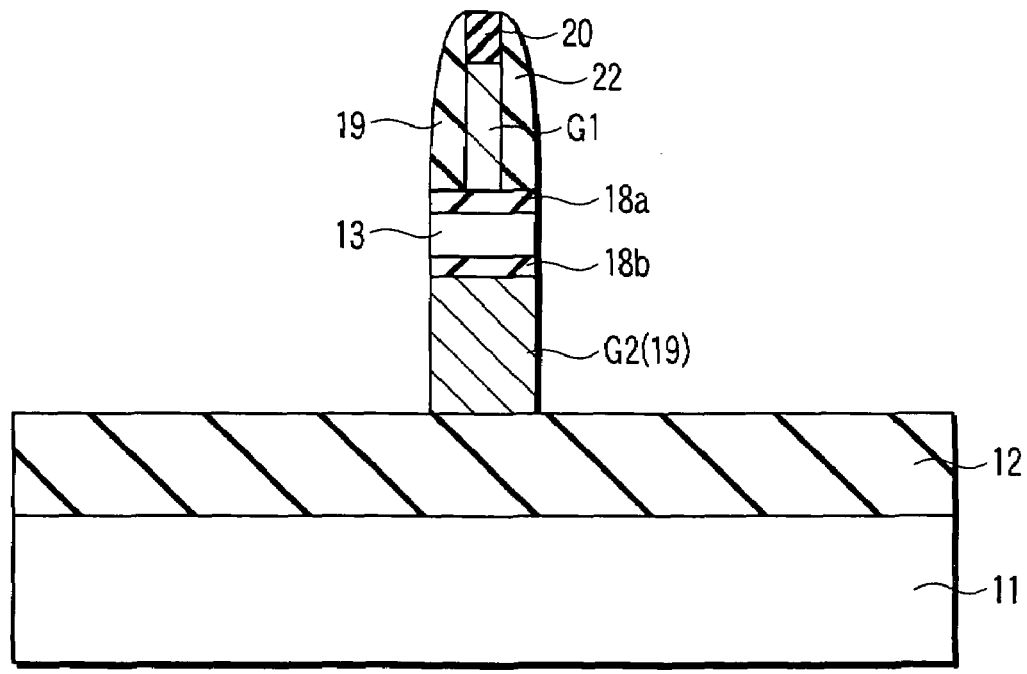
FIG. 10B is a sectional view taken along a line XB—XB in FIG. 10A.

As shown in FIGS. 10A and 10B, the first and second gate insulating films 18a and 18b, Si/SiGe layer 13, and polysilicon layer 19 are etched by anisotropic etching such as RIE. In this etching, the gate sidewall layer 22 is used as a mask, and the buried oxide film 12 is used as a stopper. Note that during RIE, the ions penetrate the gate insulating films 18a and 18b twice, so the etching conditions for the individual layers are desirably respectively changed to suitable conditions. In this manner, a back gate electrode G2 can be formed in self-alignment with the top gate electrode G1 and gate sidewall layer 22. After that, the resist 23 is removed.

Figure 11A:
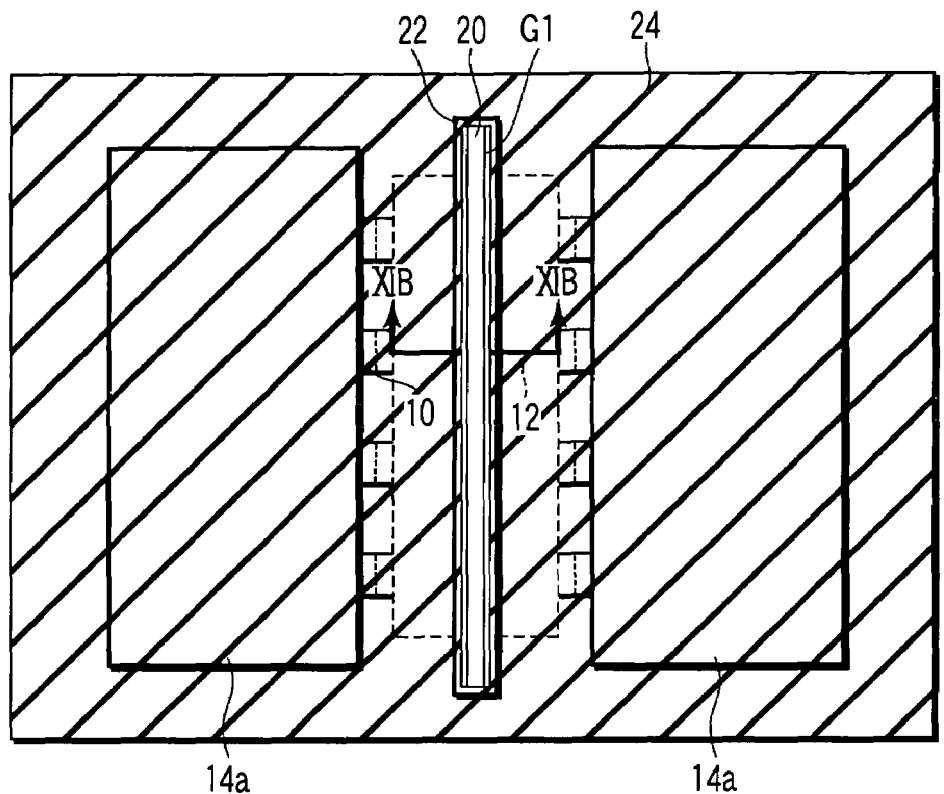
FIG. 11A is a plan view showing a fabrication step, following FIG. 10A, of the semiconductor device according to the first embodiment of the present invention.
Figure 11B:
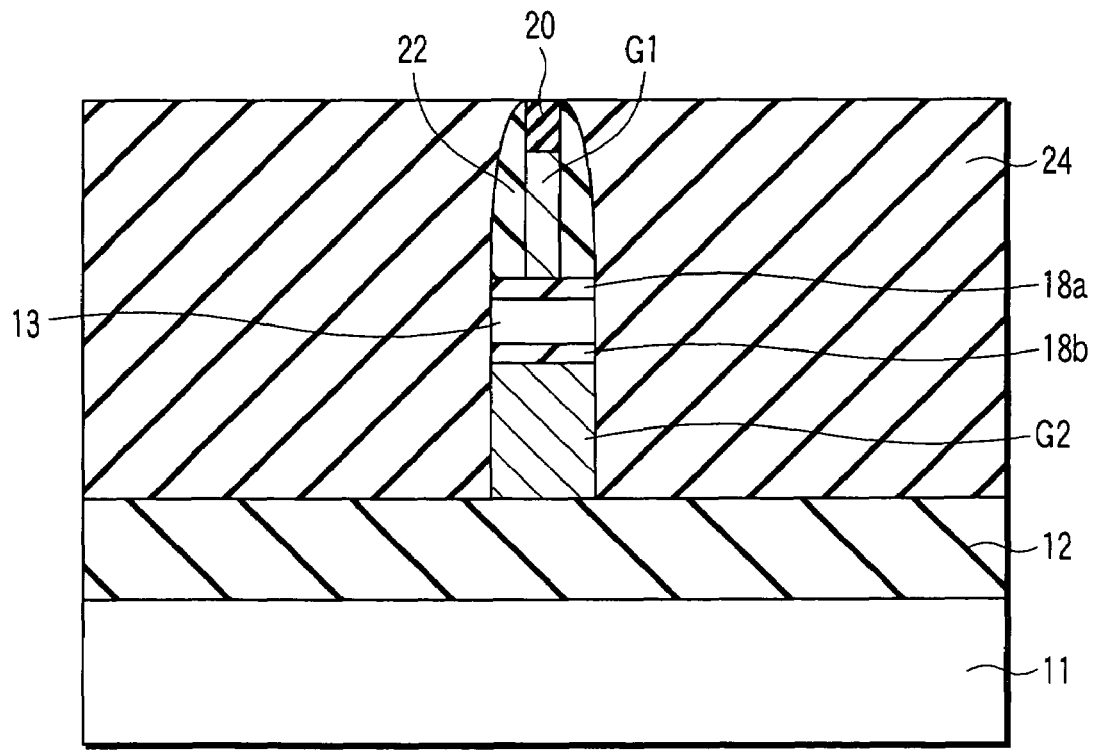
FIG. 11B is a sectional view taken along a line XIB—XIB in FIG. 11A.

As shown in FIGS. 11A and 11B, an interlayer dielectric film 24 is deposited on the mask material 20 and buried insulating film 12. The interlayer dielectric film 24 is then planarized by CMP (Chemical Mechanical Polish) or the like, until the mask material 20 is exposed. A film such as plasma SiN is suited as the interlayer dielectric film 24 because the film thickness can be relatively small and the film functions as sidewalls when epitaxial growth is performed later.

Figure 12A:
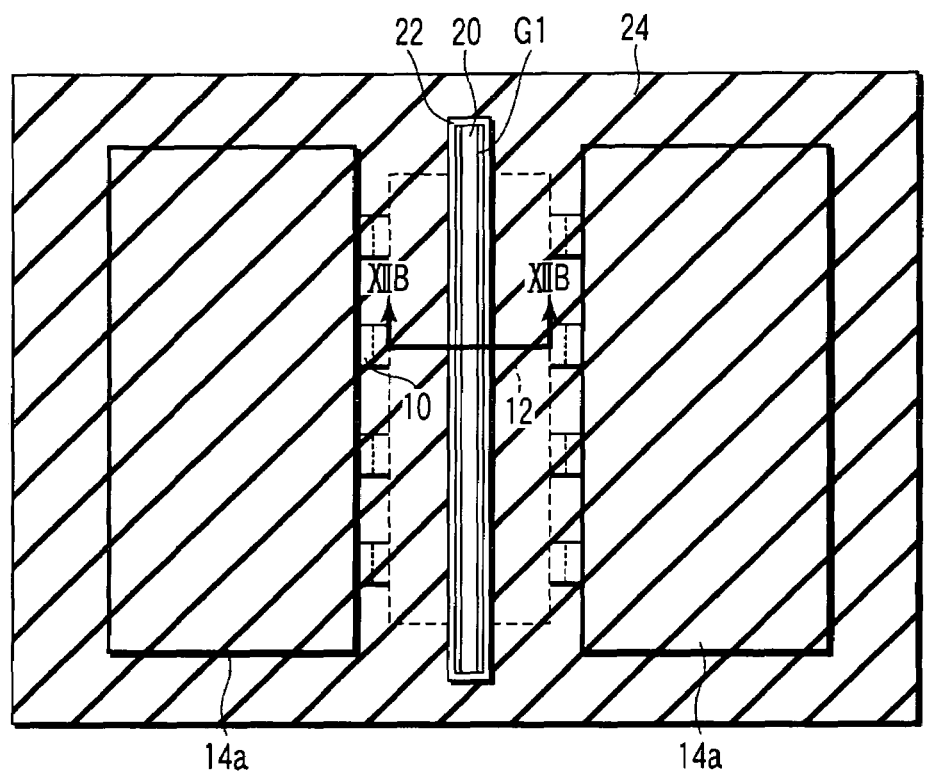
FIG. 12A is a plan view showing a fabrication step, following FIG. 11A, of the semiconductor device according to the first embodiment of the present invention.
Figure 12B:
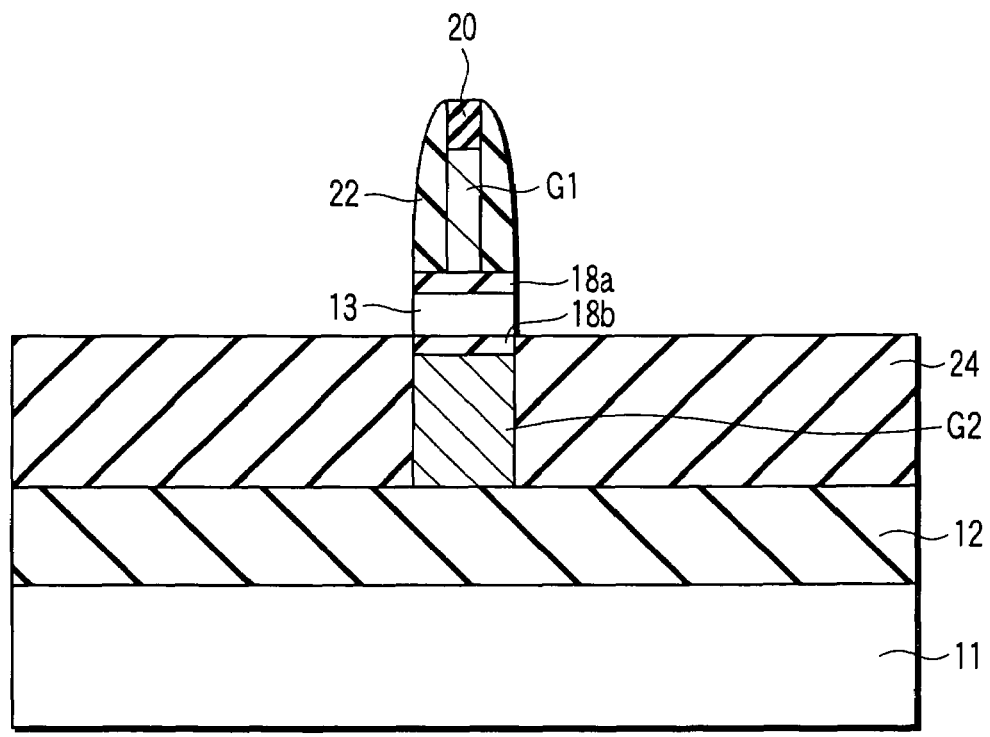
FIG. 12B is a sectional view taken along a line XIIB—XIIB in FIG. 12A.

As shown in FIGS. 12A and 12B, the interlayer dielectric film 24 is etched back so that its upper surface is positioned near the upper surface of the gate insulating film 18b. If the upper surface of the interlayer dielectric film 24 is positioned below the bottom surface of the second gate insulating film 18b, the back gate electrode G2 is undesirably brought into contact with the epitaxially grown material later. On the other hand, if the upper surface of the interlayer dielectric film 24 is much higher than the upper surface of the gate insulating film 18b, the dielectric film extends toward the channel, resulting in a parasitic resistance increase. For example, the upper surface of the interlayer dielectric film 24 may be positioned between the upper surface and the bottom surface of the second gate insulating film 18b.

Figure 13A:
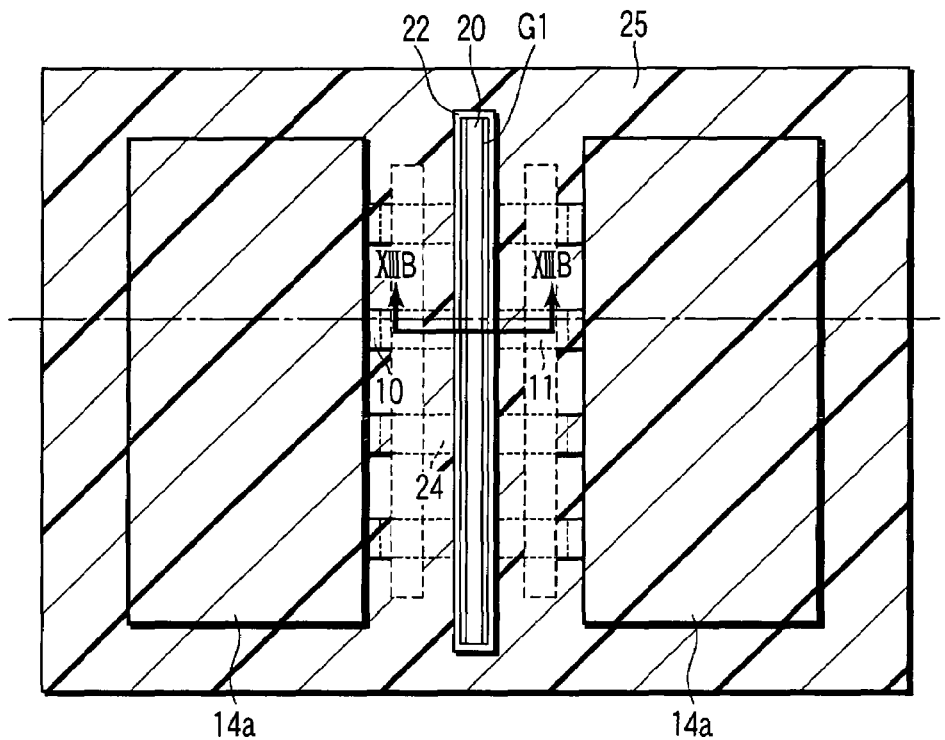
FIG. 13A is a plan view showing a fabrication step, following FIG. 12A, of the semiconductor device according to the first embodiment of the present invention.
Figure 13B:
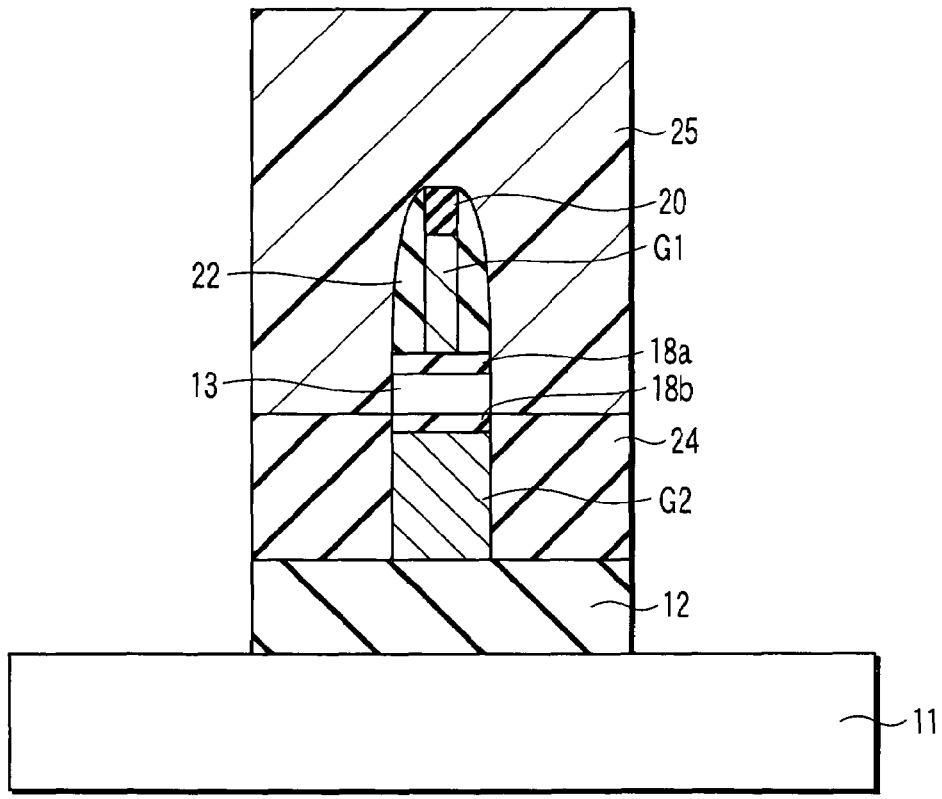
FIG. 13B is a sectional view taken along a line XIIIB—XIIIB in FIG. 13A.

As shown in FIGS. 13A and 13B, a resist 25 is formed on the mask material 20 and interlayer dielectric film 24, and patterned. Then, the interlayer dielectric film 24 and buried insulating film 12 in regions well separated from the back gate electrode G2 are etched away to partially expose the silicon substrate 11. After that, the resist 25 is removed.

Figure 14A:
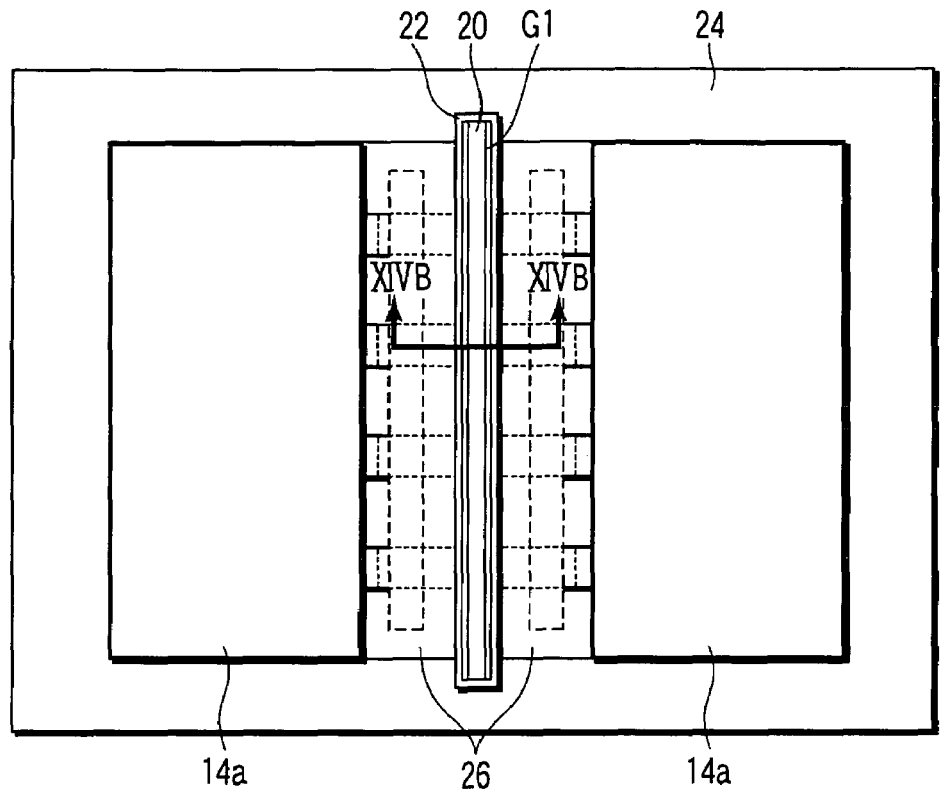
FIG. 14A is a plan view showing a fabrication step, following FIG. 13A, of the semiconductor device according to the first embodiment of the present invention.
Figure 14B:
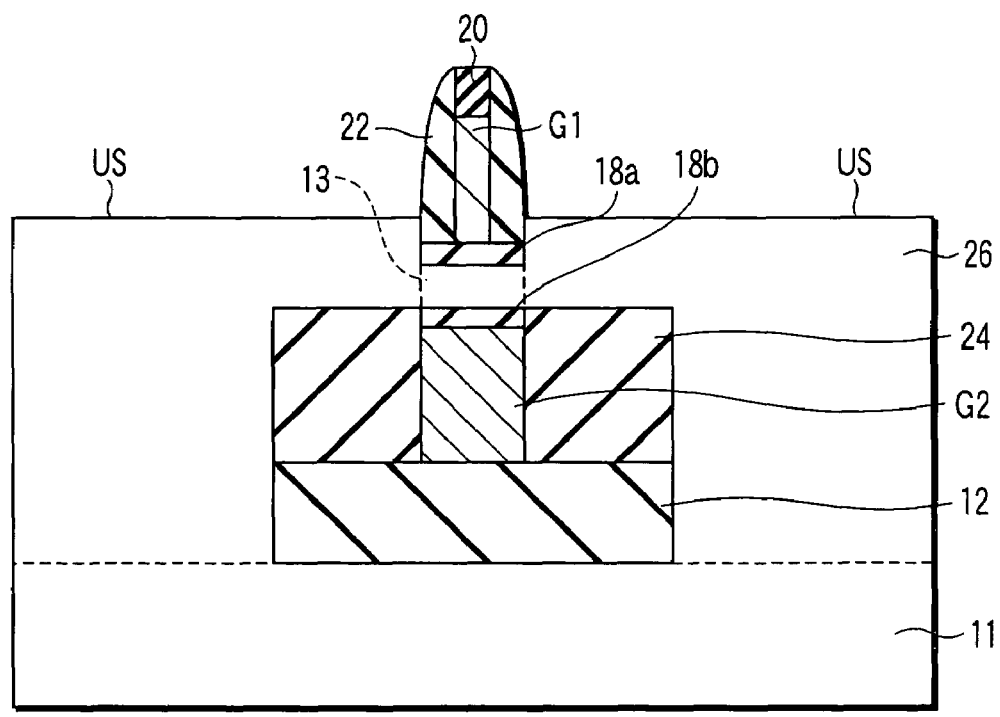
FIG. 14B is a sectional view taken along a line XIVB—XIVB in FIG. 14A.

As shown in FIGS. 14A and 14B, Si is epitaxially grown by using the exposed silicon substrate 11 and Si/SiGe layer 13 as seed layers. In this way, an epitaxial layer 26 having an upper surface US higher than the upper surface of the first gate insulating film 18a is formed.

Then, as shown in FIGS. 1A and 1B, often the gate sidewall layer 22 is removed, a gate sidewall layer 27 is formed on the side surfaces of the top gate electrode G1. After that, a source diffusion region 28a and drain diffusion region 28b are formed in the epitaxial layer 26 by ion implantation and activation. Although contact regions and interconnect regions are formed after that, these formation steps will be omitted because the same process as the conventional MOSFET fabrication process is presumably applicable. Note that a silicide layer may also be formed on the surfaces of the source diffusion region 28a and drain diffusion region 28b.

In the first embodiment described above, the top gate electrode G1 and back gate electrode G2 can be formed in self-alignment with each other in the planar double-gate MOSFET. Therefore, the gate length L2 of the back gate electrode G2 can be made equivalent to the sum of the gate length L1 of the top gate electrode G1 and the widths W1 and W2 of the gate sidewall layer 27. That is, the gate length L2 of the back gate electrode G2 can be made smaller than that in the conventional semiconductor device. Accordingly, it is possible to reduce the region where the back gate electrode G2 overlaps the source diffusion region 28a and drain diffusion region 28b, decrease the parasitic gate overlap capacitance Cov of the back gate electrode G2, and reduce the parasitic resistance as well.

Also, in the double-gate MOSFET as in the first embodiment, the same voltage is applied to the top gate electrode G1 and back gate electrode G2 at the same time. Therefore, Fermi levels are pulled by the potential of two gate electrodes G1 and G2 to form a channel region C in the surface portions of the two side surfaces (e.g., K. W. Guarini et al.) Since a depletion layer can be controlled by the two gate electrodes G1 and G2 on the two sides of the thin channel region C, the short channel effect can be effectively suppressed. In addition, the electric field (indicated by the slope of a potential curve near the channel in a band diagram) near the surface of the channel region C is more moderate than that in the conventional single-gate MOSFET, so the carrier mobility can be slightly increased.

In the first embodiment, an SGOI structure is formed only immediately below the gate electrodes G1 and G2. Therefore, the source diffusion region 28a and drain diffusion region 28b are connected to the silicon substrate 11 by the epitaxial layer 26. This makes it possible to minimize self-heating, and prevent deterioration of the characteristics.

Note that the first embodiment has the following characteristics when compared to S. Harrison et al. (1) The back gate electrode G2 can be formed in self-alignment with the top gate electrode G1. (2) The maximum gate length L2 of the back gate electrode G2 is determined by the sum of the gate length L1 of the top gate electrode G1 and the widths W1 and W2 of the gate sidewall layer 27, therefore, the overlap of the back gate electrode G2 and the source diffusion region 28a and drain diffusion region 28b can be decreased.

Note also that the first embodiment has the following characteristics when compared to K. W. Guarini et al. (1) A self-alignment structure can be formed without using any bonding step. (2) The overlap capacitance of the back gate electrode G2 and the source diffusion region 28a and drain diffusion region 28b can be decreased, whereas the parasitic capacitance is large in K. W. Guarini el al. because the gate side walls form the source/drain.

SECOND EMBODIMENT

A planar double-gate MOSFET of the second embodiment is a modification of the first embodiment, and a gate length L2 of a back gate electrode G2 is made smaller than that in the first embodiment.

FIG. 15 is a sectional view of a semiconductor device according to the second embodiment of the present invention. This semiconductor device according to the second embodiment will be explained below. Note that in the second embodiment, differences from the first embodiment will be mainly explained, and the same features as in the first embodiment will be omitted.

As shown in FIG. 15, side surfaces SSG2 of the back gate electrode G2 are positioned inside side surfaces SS of an epitaxial layer 26, and substantially aligned with side surfaces SSG1 of a top gate electrode G1. Accordingly, the gate length L2 of the back gate electrode G2 is substantially the same as a gate length L1 of the top gate electrode G1.

The side surfaces of the back gate electrode G2 are covered with an oxide film 31. The oxide film 31 has a step 33. That is, the oxide film 31 has a first upper surface in contact with a second gate insulating film 18b, and a second upper surface positioned below the first upper surface.

The side surfaces of the oxide film 31 are substantially aligned with the side surfaces of a gate sidewall layer 27. The sum of the gate length L2 of the back gate electrode G2 and widths W3 and W4 of the oxide film 31 is equal to the sum of the gate length L1 of the top gate electrode G1 and widths W1 and W2 of the gate sidewall layer 27. Note that the widths W1 and W2 of the gate sidewall layer 27 are the widths of the lower portions of the gate sidewall layer 27, e.g., the widths near a first gate insulating film 18a and positioned below an upper surface US of the epitaxial layer 26. Also, the widths W3 and W4 of the oxide film 31 are the widths of the lower portions of the back gate electrode G2, e.g., the widths in portions in contact with an interlayer dielectric film 24, or the widths in portions having no step 33.

A thickness T2 of the epitaxial layer 26 (a source diffusion region 28a and drain diffusion region 28b) between the upper surface US of the epitaxial layer 26 and the second upper surface of the oxide film 31 (the upper surface of the interlayer dielectric film 24) is larger than that in the first embodiment, with respect to a thickness T1 of a channel region C sandwiched between the top gate electrode G1 and back gate electrode G2. In addition, the thickness T2 extends not only to the top gate electrode G1 but also to the back gate electrode G2, with respect to the channel region C. The second upper surface of the oxide film 31 (the upper surface of the interlayer dielectric film 24) is positioned below the upper surface of the second gate insulating film 18b (the bottom surface of the channel region C).

The interlayer dielectric film 24 is formed on the side surfaces of the oxide film 31. The oxide film 31 is desirably made of a material different from the interlayer dielectric film 24. The upper surface of the interlayer dielectric film 24 is on the same level as the second upper surface of the oxide film 31. The side surfaces on the opposite sides of the interlayer dielectric film 24 from the oxide film 31 are aligned with the side surfaces of a buried insulating film 12. Note that in the structure of the second embodiment, the interlayer dielectric film 24 is not essential but has the effect of reducing the parasitic capacitance of the back gate electrode G2.

FIGS. 16 to 23 are cross sectional views of fabrication steps of the semiconductor device according to the second embodiment of the present invention. A method of fabricating the semiconductor device according to the second embodiment will be briefly explained below.

First, a structure shown in FIG. 16 is formed through steps similar to FIGS. 2A and 2B to FIGS. 10A and 10B in the first embodiment. In the second embodiment, however, the material of a gate sidewall layer 22 is limited to a film such as an SiN-based film that is not oxidized in conventional oxidation method. This is because an oxidation step and oxide film removal step are combined as will be described later, and a film, which is not oxidized, can prevent oxidation of the top gate electrode G1, and prevent the shape from receding and changing during etching.

Figure 17:
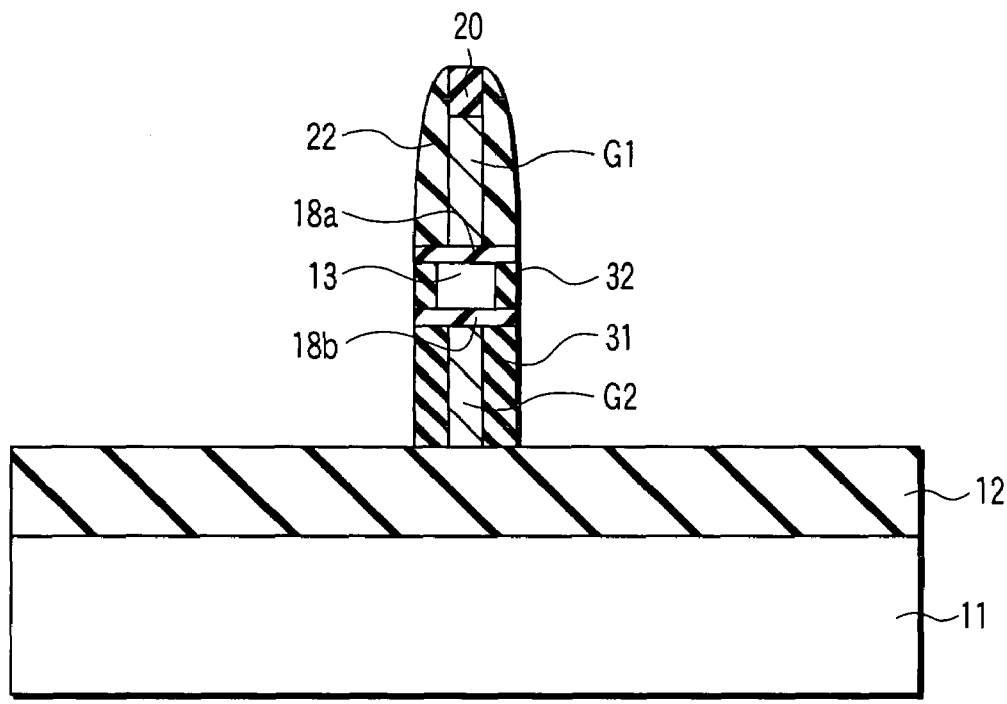

Then, as shown in FIG. 17, thermal oxidation is performed to thin the back gate electrode G2 by slimming. Consequently, an oxide film 31 is formed on the side surfaces of the back gate electrode G2, and an oxide film 32 is formed on the side surfaces of a Si/SiGe layer 13. Since the side surfaces of the top gate electrode G1 are covered with the gate sidewall layer 22, the top gate electrode G1 is not oxidized. Note that thinning of the back gate electrode G2 is not limited to thermal oxidation and may also be wet etching.

Figure 18:
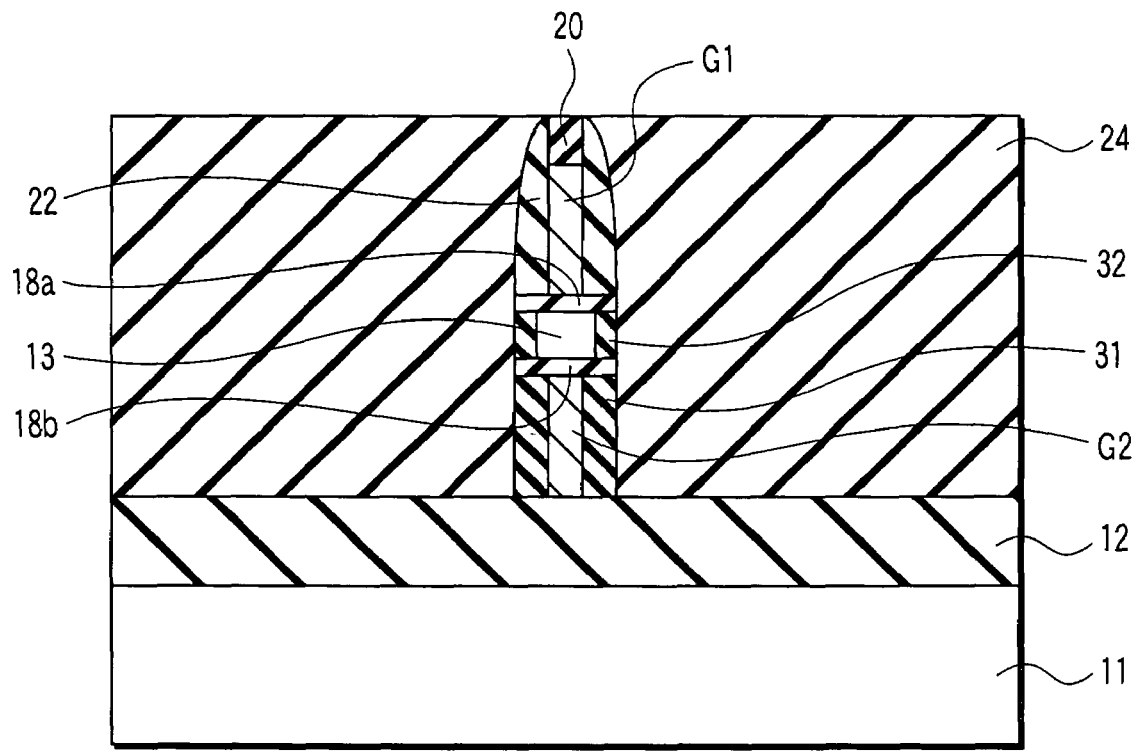

As shown in FIG. 18, an interlayer dielectric film 24 is deposited on a mask material 20 and buried insulating film 12. The interlayer dielectric film 24 is planarized by CMP or the like until the mask material 20 is exposed. As in the first embodiment, the interlayer dielectric film 24 is preferably a film that is not etched even while the oxide films 31 and 32 are etched, so a film such as plasma SiN is presumably favorable.

As shown in FIG. 19, the interlayer dielectric film 24 is etched back. In the second embodiment, unlike in the first embodiment, the upper surface of the interlayer dielectric film 24 need not be positioned near the upper surface of the gate insulating film 18b. For example, in the second embodiment, the upper surface of the interlayer dielectric film 24 is positioned below the bottom surface of the second gate insulating film 18b. This makes it possible to form a low-resistance source/drain region such as an elevated source/drain with respect to the back gate electrode G2 as will be described later.

As shown in FIG. 20, the oxide film 32 on the side surfaces of the Si/SiGe layer 13 serving as a channel region C is removed by wet etching using, e.g., dilute hydrofluoric acid. In this wet etching process, the first gate insulating film 18a, second gate insulating film 18b, and oxide film 31 are also partially removed. As a consequence, the side surfaces of the Si/SiGe layer 13, those of the first and second gate insulating films 18a and 18b, and those of portions of the oxide film 31 recede from the side surfaces of the gate sidewall layer 22. This thins the shapes of these portions, thereby forming a step 33 on the oxide film 31.

As shown in FIG. 21, a resist 34 is formed on the mask material 20 and interlayer dielectric film 24, and patterned. The patterned resist 34 is used to etch the interlayer dielectric film 24 and buried insulating film 12 in portions separated from the back gate electrode G2, thereby partially exposing the surface of a silicon substrate 11.

As shown in FIG. 22, the resist 34 is removed.

Figure 23:
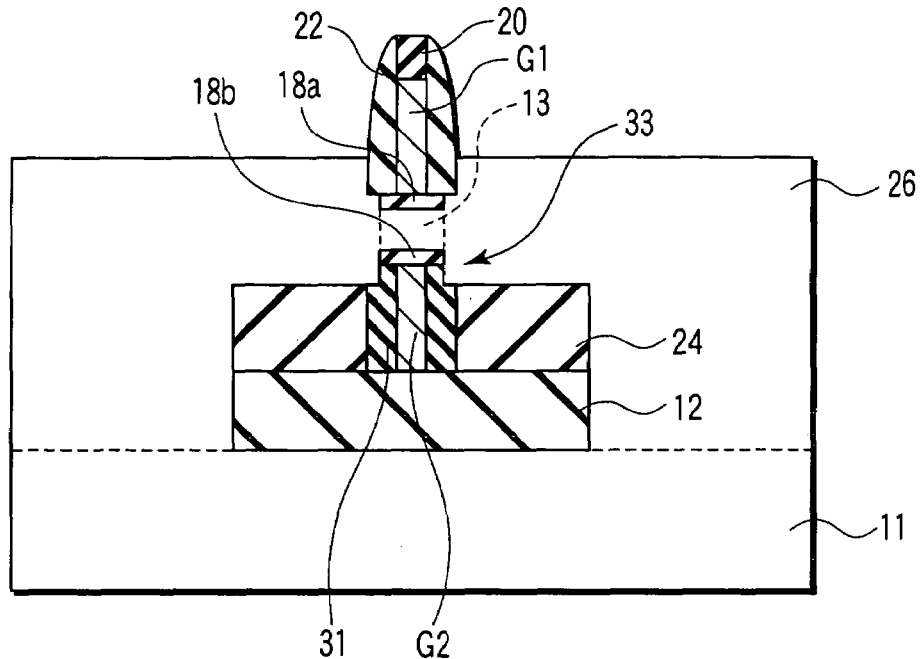

As shown in FIG. 23, Si S/D region in the silicon substrate region 11 is epitaxially grown in the vertical direction, and Si channel in the Si/SiGe layer 13 is epitaxially grown in the horizontal direction. In this way, an epitaxial layer 26 having an upper surface US positioned above the upper surface of the gate insulating film 18a is formed.

Then, as shown in FIG. 15, the gate sidewall layer 22 is removed, and a gate sidewall layer 27 is formed. After that, a source diffusion region 28a and drain diffusion region 28b are formed in the epitaxial layer 26 by ion implantation and activation. Although contact regions and interconnect regions are formed after that, these formation steps will be omitted because the same process as the conventional MOSFET fabrication process is presumably applicable. Note that a silicide layer may also be formed on the surfaces of the source diffusion region 28a and drain diffusion region 28b.

In the second embodiment, the same effects as in the first embodiment can be obtained. In addition, the following effects can also be obtained in the second embodiment.

While the self-aligned structure is maintained, it is possible to decrease the gate length L2 of the back gate electrode G2 by using the slimming step such as oxidation, thereby decreasing the gate length L2 of the back gate electrode G2 to be substantially the same as the gate length L1 of the top gate electrode G1. Accordingly, a parasitic gate overlap capacitance Cov of the back gate electrode G2 can be further decreased.

The source diffusion region 28a and drain diffusion region 28b near the channel region C extend not only to the top gate electrode G1 but also to the back gate electrode G2 with respect to the channel region C. That is, a so-called elevated source/drain (raised S/D) structure is applied to both the top gate electrode G1, and back gate electrode G2. Therefore, the parasitic resistance as a double-gate MOSFET can be reduced more easily than in a normal single-gate FD (Fully Depleted)-SOI structure.

THIRD EMBODIMENT

The third embodiment is a planar double-gate MOSFET in which a top gate electrode G1 and back gate electrode G2 are formed in self-alignment with each other. In addition, a thin buried insulating film is formed only below a channel region. This buried insulating film functions as a gate insulating film of the back gate electrode, and insulates a source/drain region from a semiconductor substrate.

Figure 24:
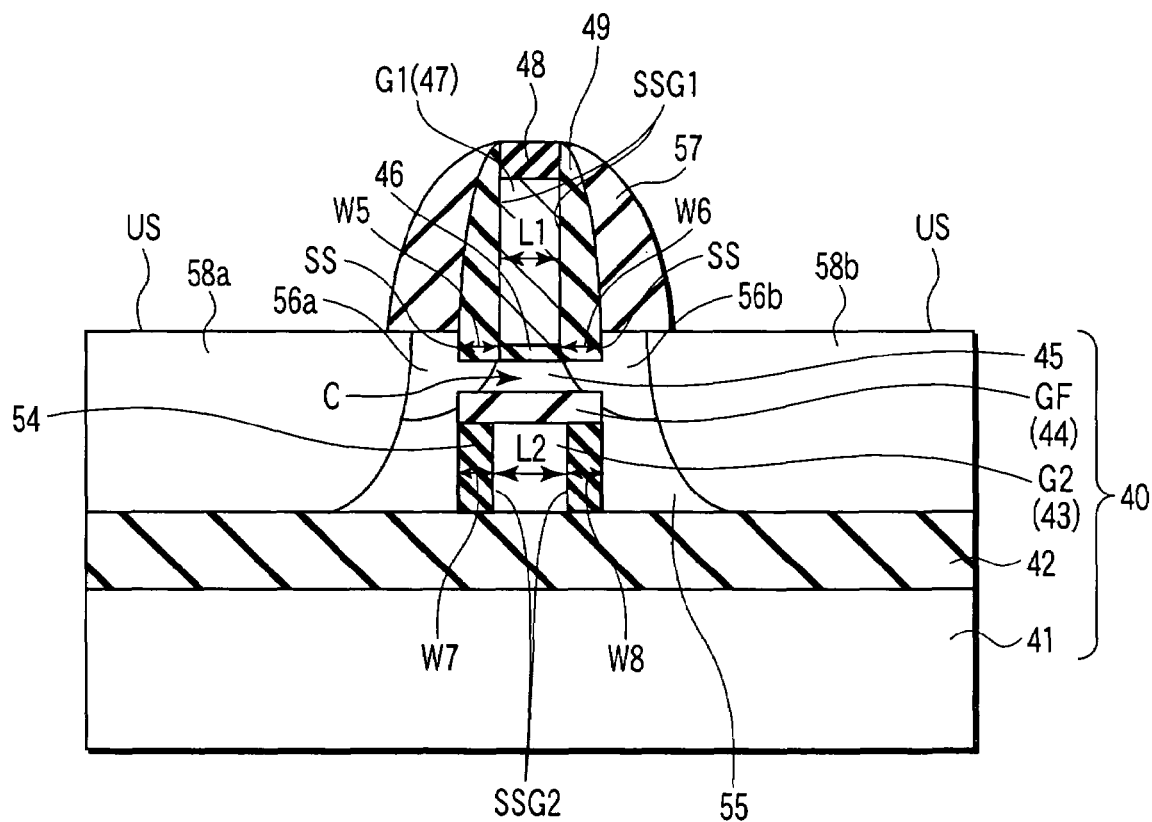
FIG. 24 is a sectional view showing a semiconductor device according to the third embodiment of the present invention.

FIG. 24 is a cross sectional view of a semiconductor device according to the third embodiment of the present invention. This semiconductor device according to the third embodiment will be described below.

As shown in FIG. 24, a substrate 40 used in the third embodiment is made up of a silicon substrate 41, first and second buried insulating films 42 and 44, and first and second SOI layers 43 and 45. That is, the substrate 40 has the two SOI layers 43 and 45 and the two buried insulating films 42 and 44.

The first buried insulating film 42 is formed on the silicon substrate 41, and an epitaxial layer 55 is formed on the first buried insulating film 42. A pair of a source diffusion region 58a and drain diffusion region 58b is formed on the surface of the epitaxial layer 55. A pair of extension regions 56a and 56b are formed contiguously with the source diffusion region 58a and drain diffusion region 58b, respectively. A channel region C connecting the source diffusion region 58a and drain diffusion region 58b is formed between the extension regions 56a and 56b.

The top gate electrode G1 is formed on the channel region C via a gate insulating film 46. Gate sidewall layers 49 and 57 are formed on the side surfaces of the top gate electrode G1, and a mask material 48 is formed on the upper surface of the top gate electrode G1.

The back gate electrode G2 is formed below the channel region C via the second buried insulating film 44 which functions as a gate insulating film GF. The side surfaces of the back gate electrode G2 are covered with a gate sidewall layer 54, and the bottom surface of the back gate electrode G2 is covered with the first buried insulating film 42.

An upper surface US of the epitaxial layer 55 is positioned above the upper surface of the channel region C. Side surfaces SS, which face the top gate electrode G1, of the epitaxial layer 55 are in contact with the gate sidewall layer 49. Since the gate sidewall layer 57 is formed on the epitaxial layer 55, portions of the upper surface SS of the epitaxial layer 55 are in contact with the gate sidewall layer 57.

The back gate electrode G2 and gate sidewall layer 54 are formed in self-alignment with the top gate electrode G1, and gate sidewall layer 49. Therefore, the side surfaces of the gate sidewall layer 54 are substantially aligned with those of the gate sidewall layer 49, i.e., the side surfaces of the gate sidewall layer 54 are aligned with the side surfaces SS of the epitaxial layer 55. Also, side surfaces SSG2 of the back gate electrode G2 are substantially aligned with side surfaces SSG1 of the top gate electrode G1, and the gate length L2 of the back gate electrode G2 is substantially equal to the gate length L1 of the top gate electrode G1. In other words, the sum of the gate length L2 of the back gate electrode G2 and widths W7 and W8 of the gate sidewall layer 54 is equal to the sum of the gate length L1 of the top gate electrode G1, and widths W5 and W6 of the gate sidewall layer 49. Note that the widths W5 and W6 of the gate sidewall layer 49 are those of the lower portions of the gate sidewall layer 49, e.g., those near the gate insulating film 46 and positioned below the upper surface US of the epitaxial layer 55.

The source diffusion region 58a and drain diffusion region 58b are insulated from the silicon substrate 41 by the first buried insulating film 42, and in contact with the first buried insulating film 42.

The upper surface of the gate sidewall layer 54 is on the same level as the upper surface of the back gate electrode G2. The side surfaces on the opposite sides of the gate sidewall layer 54 from the back gate electrode G2 are aligned with those of the gate insulating film GF.

The top gate electrode G1 and back gate electrode G2 are made of different materials in this embodiment, although they may also be made of the same material.

The gate insulating films GF and 46 are made of different materials in this embodiment, although they may also be made of the same material. The film thickness of the gate insulating film GF is larger than that of the gate insulating film 46 and smaller than that of the first buried insulating film 42.

FIGS. 25 to 32 are cross sectional views of fabrication steps of the semiconductor device according to the third embodiment of the present invention. A method of fabricating the semiconductor device according to the third embodiment will be briefly explained below.

Figure 25:
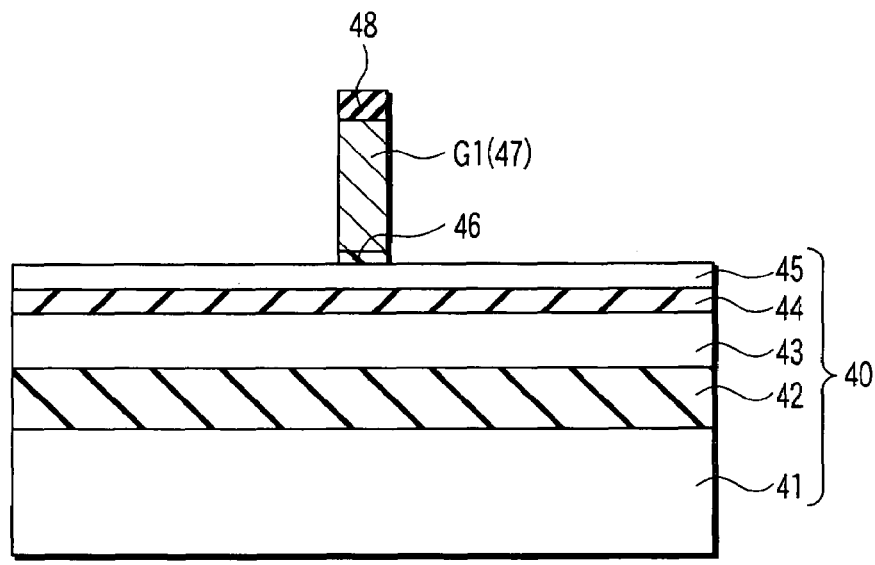

First, as shown in FIG. 25, the third embodiment uses a substrate 40 made up of a silicon substrate 41, first and second buried insulating films 42 and 44, and first and second SOI layers 43 and 45. A gate insulating film 46 (e.g., SiON) is formed on the second SOI layer 45, and an electrode material (e.g., a polysilicon film) 47 is formed on the gate insulating film 46. A mask material (e.g., SiN) 48 is formed on the electrode material 47, and patterned. After that, the electrode material 47 and gate insulating film 46 are processed by using the mask material 48, thereby forming a top gate electrode G1.

Figure 26:
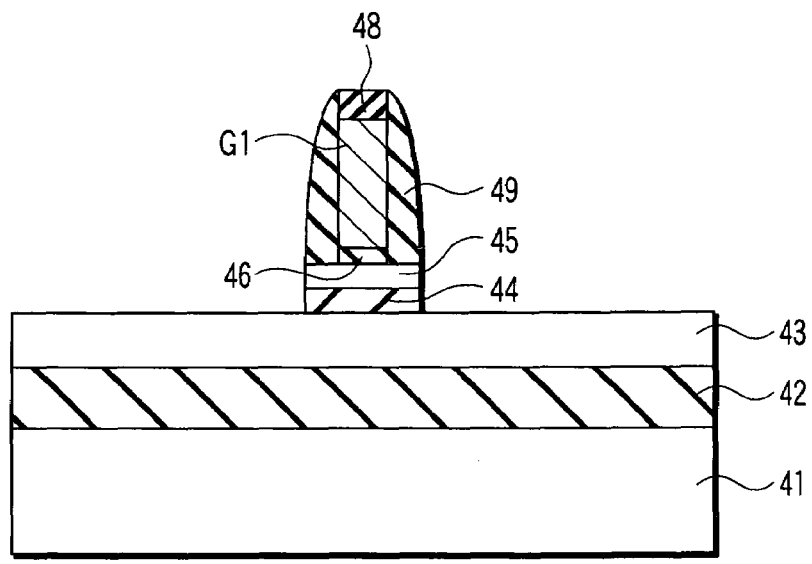

Then, as shown in FIG. 26, a first gate sidewall layer (e.g., SiN) 49 is formed on the side surfaces of the gate insulating film 46, top gate electrode G1, and mask material 48. In addition, the second SOI layer 45 and second buried insulating film 44 except for a channel region are etched.

Figure 27:
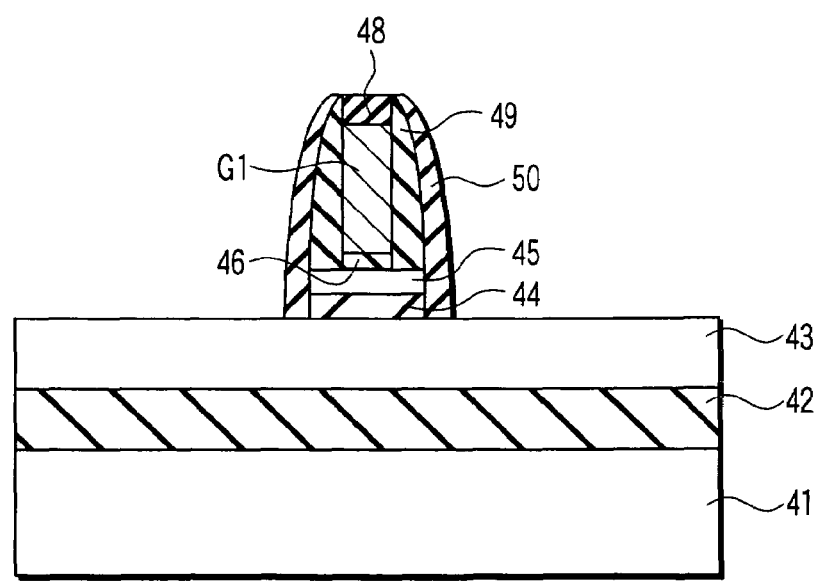

As shown in FIG. 27, a second gate sidewall layer 50 is formed on the side surfaces of the first gate sidewall layer 49, second SOI layer 45, and second buried insulating film 44. The second gate sidewall layer 50 is desirably made of a material having high selectivity to the material of the first gate sidewall layer 49. An example is an $SiO_2$ film.

Figure 28:
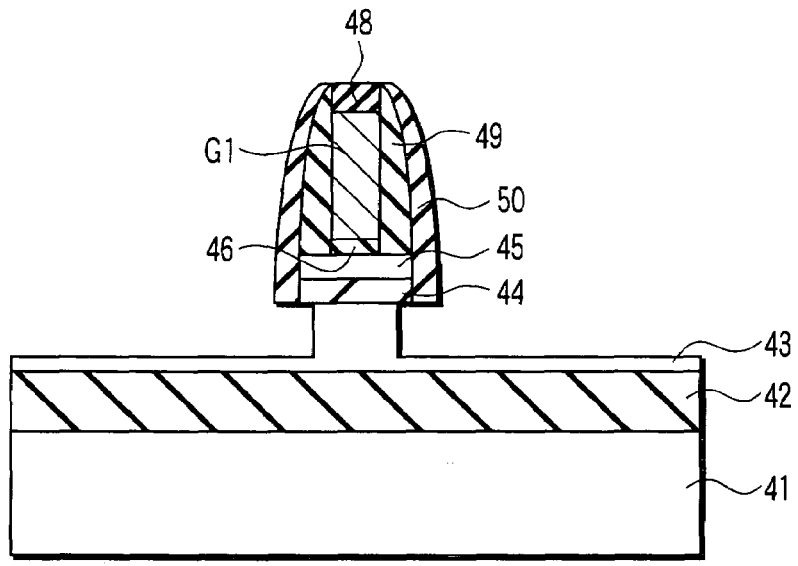

As shown in FIG. 28, the obtained structure is etched to the middle of the first SOI layer 43 by isotropic dry etching such as CDE (Chemical Dry Etching). The thickness of the first SOI layer 43 left behind on the first buried insulating film 42 is set such that no agglomeration occurs in the subsequent Si epitaxial growth step.

Figure 29:
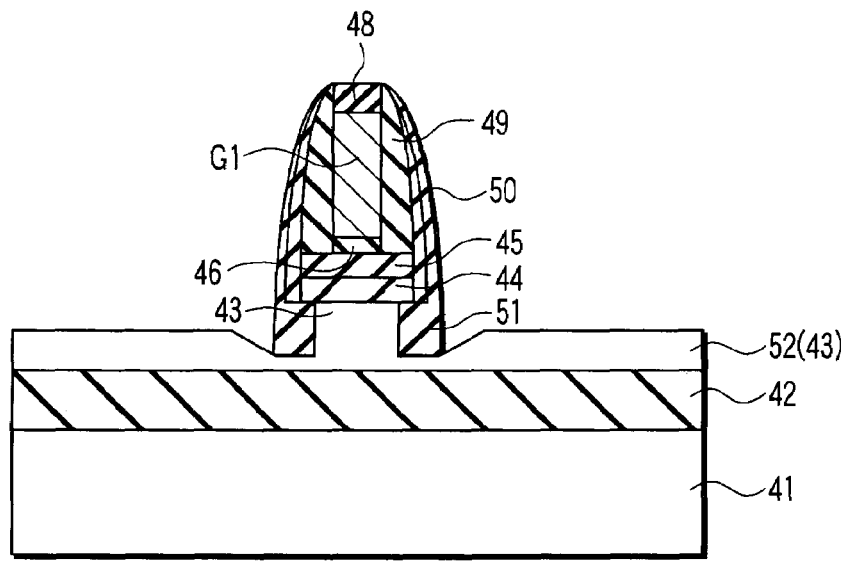

As shown in FIG. 29, a third gate sidewall layer (e.g., an $SiO_2$ film) 51 is further formed on the side surfaces of the columnar first SOI layer 43 and on the side surfaces of the second gate sidewall layer 50. After that, Si is epitaxially grown by using the first SOI layer 43 left behind on the first buried insulating film 42 as a seed layer, thereby forming an epitaxial layer 52.

Figure 30:
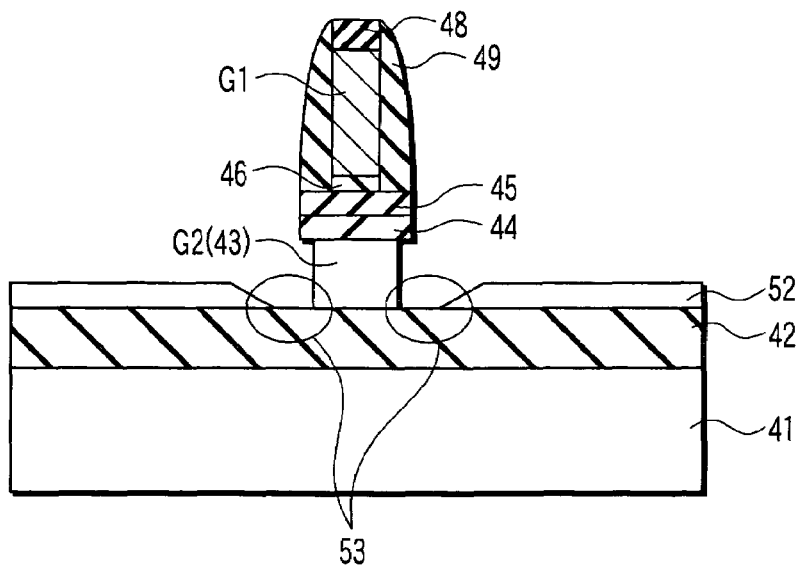

As shown in FIG. 30, the second and third gate sidewall layers 50 and 51 are removed. After that, the entire surface of the epitaxial layer 52 is etched back to form exposed portions 53 in which the first buried insulating film 42 is partially exposed. In this manner, the epitaxial layer 52 and columnar first SOI layer 43 are separated, and a back gate electrode G2 is formed.

As shown in FIG. 31, a fourth gate sidewall layer (e.g., SiN) 54 is formed on the side surfaces of the back gate electrode G2, so the side surfaces of the back gate electrode G2 are covered with the fourth gate sidewall layer 54.

As shown in FIG. 32, the epitaxial layer 52 is further epitaxially grown, and Si in the channel region is also epitaxially grown in the horizontal direction, thereby forming an epitaxial layer 55 having an upper surface US positioned above the upper surface of the channel region 45.

Then, as shown in FIG. 24, extension regions 56a and 56b are formed in the epitaxial layers 55 by ion implantation. A fifth gate sidewall layer 57 is further formed on the side surfaces of the fourth gate sidewall layer 49. After that, a source diffusion region 58a and drain diffusion region 58b are formed in the epitaxial layer 55 by ion implantation and activation. Although contact regions and interconnection regions are formed after that, these formation steps will be omitted because the same process as the conventional MOSFET fabrication process is presumably applicable. Note that a silicide layer may also be formed on the surfaces of the source diffusion region 58a and drain diffusion region 58b.

In the third embodiment described above, the top gate electrode G1 and back gate electrode G2 can be formed in self-alignment with each other in the planar double-gate MOSFET. Therefore, the gate length L2 of the back gate electrode G2 can be made equivalent to the gate length L1 of the top gate electrode G1. That is, the gate length L2 of the back gate electrode G2 can be made smaller than that in the conventional semiconductor device. Accordingly, it is possible to reduce the region where the back gate electrode G2 overlaps the source diffusion region 58a and drain diffusion region 58b, decrease the parasitic gate overlap capacitance Cov of the back gate electrode G2, and reduce the parasitic resistance as well. In addition, since the source diffusion region 58a and drain diffusion region 58b are in contact with the first buried insulating film 42 having a sufficient thickness, the parasitic capacitance can be decreased.

Also, the film thicknesses of the buried insulating film 44 and SOI layer 45 in the channel region C are decreased. Therefore, the short channel effect of the MOSFET can be suppressed while the substrate impurity concentration is decreased.

Furthermore, the second buried insulating film 44 is used as the gate insulating film GF of the back gate electrode G2. The gate insulating film GF of the back gate electrode G2 is a thin film, although it is thicker than a normal gate insulating film. Therefore, the device can be well operated as a double-gate MOSFET by applying a voltage to the back gate electrode G2.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate;
    a channel region formed above the semiconductor substrate;
    a first gate electrode formed above the channel region via a first gate insulating film;
    a second gate electrode formed below the channel region via a second gate insulating film to face the first gate electrode;
    a first insulating film covering side surfaces of the second gate electrode;
    a second insulating film covering a bottom surface of the second gate electrode; and
    a semiconductor layer which has an upper surface positioned above an upper surface of the first gate insulating film and side surfaces facing side surfaces of the first gate electrode, and in which a source region and drain region are formed,
    wherein the side surfaces of the second gate electrode are aligned with or positioned inside the side surfaces of the semiconductor layer and an upper surface of the first insulating film is positioned below an upper surface of the second gate insulating film.

2. A semiconductor device comprising:

a semiconductor substrate;

a channel region formed above the semiconductor substrate;

a first gate electrode formed above the channel region via a first gate insulating film;

a second gate electrode formed below the channel region via a second gate insulating film to face the first gate electrode;

a first insulating film covering side surfaces of the second gate electrode;

a second insulating film covering a bottom surface of the second gate electrode;

a semiconductor layer which has an upper surface positioned above an upper surface of the first gate insulating film and side surfaces facing side surfaces of the first gate electrode, and in which a source region and drain region are formed; and a third insulating film formed on side surfaces of the first insulating film by using a material different from the first insulating film, wherein the side surfaces of the second gate electrode are aligned with or positioned inside the side surfaces of the semiconductor layer.

3. The device according to claim 2, wherein side surfaces on opposite sides of the third insulating film from the first insulating film are aligned with side surfaces of the second insulating film.

* * * * *